United States Patent
Arai et al.

(10) Patent No.: US 12,425,061 B2
(45) Date of Patent: Sep. 23, 2025

(54) WATERPROOF STRUCTURE FOR COMMUNICATION DEVICE, COMMUNICATION UNIT, AND WORKING MACHINE

(71) Applicant: KUBOTA CORPORATION, Osaka (JP)

(72) Inventors: Yasuhiko Arai, Sakai (JP); Keisuke Miura, Sakai (JP); Tokio Sakata, Sakai (JP)

(73) Assignee: KUBOTA CORPORATION, Osaka (JP)

( * ) Notice: Subject to any disclaimer, the term of this patent is extended or adjusted under 35 U.S.C. 154(b) by 575 days.

(21) Appl. No.: 17/939,476

(22) Filed: Sep. 7, 2022

(65) Prior Publication Data

US 2023/0024613 A1    Jan. 26, 2023

Related U.S. Application Data

(63) Continuation of application No. PCT/JP2021/011129, filed on Mar. 18, 2021.

(30) Foreign Application Priority Data

Mar. 19, 2020  (JP) .................................. 2020-049480
Mar. 19, 2020  (JP) .................................. 2020-049481

(51) Int. Cl.
*H04B 1/38*     (2015.01)
*E02F 9/08*     (2006.01)
(Continued)

(52) U.S. Cl.
CPC ......... *H04B 1/3822* (2013.01); *E02F 9/0858* (2013.01); *H04B 1/03* (2013.01); *H05K 5/0214* (2022.08)

(58) Field of Classification Search
CPC ... E02F 9/0858; H05K 5/0213; H05K 5/0214; H04B 1/3822; H04B 1/03
See application file for complete search history.

(56) References Cited

U.S. PATENT DOCUMENTS 7,719,833 B2 *   5/2010  Inagaki .............. H05K 7/20854
                                                           174/16.3
10,811,805 B2 * 10/2020  Yamanaka ........... H05K 5/0052
(Continued)

FOREIGN PATENT DOCUMENTS

JP      2008-251911 A      10/2008
JP      2011118802 A  *    6/2011
(Continued)

OTHER PUBLICATIONS

Official Communication issued in European Patent Office (EPO) Patent Application No. 21772325.3, dated Mar. 28, 2024.
(Continued)

*Primary Examiner* — Abiy Teka
(74) *Attorney, Agent, or Firm* — Greenblum & Bernstein, P.L.C.

(57) ABSTRACT

Provided is a waterproof structure to prevent water ingress through an air hole in a casing of a communication device. A waterproof structure for a communication device, the communication device including a casing that houses an electronic substrate and has an air hole, includes a plate member facing the casing and attached to the casing such that the plate member covers the air hole, and a sealing member interposed between the plate member and the casing to prevent ingress of water into the air hole through a gap between the plate member and the casing.

9 Claims, 29 Drawing Sheets

(51) Int. Cl.
H04B 1/03 (2006.01)
H04B 1/3822 (2015.01)
H05K 5/02 (2006.01)

(56) References Cited

U.S. PATENT DOCUMENTS

2017/0108016 A1* 4/2017 Knoblich ............ F15B 15/1438
2018/0309185 A1  10/2018 Akiyama et al.
2018/0376604 A1  12/2018 Ohyama et al.
2019/0241124 A1   8/2019 Izumikawa et al.

FOREIGN PATENT DOCUMENTS

| | | |
|---|---|---|
| JP | 2013-16118 A | 1/2013 |
| JP | 2013-65787 A | 4/2013 |
| JP | 2018-182651 A | 11/2018 |
| JP | 2019-145678 A | 8/2019 |
| WO | 2018/084161 A1 | 5/2018 |

OTHER PUBLICATIONS

International Search Report and Written Opinion of the International Searching Authority issued in International Patent Application No. PCT/JP2021/011129, dated Jun. 15, 2021, along with an English translation thereof.

* cited by examiner

WATERPROOF STRUCTURE FOR COMMUNICATION DEVICE, COMMUNICATION UNIT, AND WORKING MACHINE

CROSS REFERENCE TO RELATED APPLICATIONS

This application is a continuation application of International Application No. PCT/JP2021/011129, filed on Mar. 18, 2021, which claims the benefit of priority to Japanese Patent Application No. 2020-049480, filed on Mar. 19, 2020, and to Japanese Patent Application No. 2020-049481, filed on Mar. 19, 2020. The entire contents of each of these applications are hereby incorporated herein by reference.

BACKGROUND OF THE INVENTION

1. Field of the Invention

The present invention relates to a waterproof structure for a communication device, a communication unit, and a working machine.

2. Description of the Related Art

Japanese Unexamined Patent Application Publication No. 2013-16118 discloses a working machine equipped with a communication network system.

The communication network system disclosed in Japanese Unexamined Patent Application Publication No. 2013-16118 includes a communication device (wireless terminal for a working machine) provided on a working machine. The communication device transmits information relating to the working machine to an information collection terminal.

The working machine disclosed in Japanese Unexamined Patent Application Publication No. 2013-16118 includes an information processor (first controller) which receives and processes information relating to the working machine, and a communication device (wireless terminal for a working machine) which receives data from the information processor. The communication device transmits information relating to the working machine to an information collection terminal.

SUMMARY OF THE INVENTION

In some communication devices, a casing which houses an electronic substrate has a hole for air escape (air hole) to prevent the occurrence of the pressure difference between the outside and the inside of the casing. The air hole in the casing may lead to water ingress through the air hole, depending on the place where the communication device is. In view of this, the communication device needs to be waterproofed to prevent water ingress through the air hole.

Furthermore, with regard to the working machine, the communication device and the information processor need to be capable of being attached to the machine body in a suitable manner and arranged in a suitable manner.

An object of the present invention is to provide a waterproof structure to prevent water ingress through an air hole in a casing of a communication device.

Another object of the present invention is to provide a communication unit and a working machine in each of which a communication device and an information processor can be attached and arranged in a suitable manner.

A waterproof structure for a communication device according to an aspect of the present invention is a waterproof structure for a communication device including a casing that houses an electronic substrate and has an air hole, the waterproof structure including a plate member facing the casing and attached to the casing such that the plate member covers the air hole, and a sealing member interposed between the plate member and the casing to prevent ingress of water into the air hole through a gap between the plate member and the casing.

The sealing member may be in the form of a plate.

The sealing member may include a groove portion, one of opposite ends of the groove portion in a longitudinal direction being in communication with the air hole. The groove portion may include, at the other of the opposite ends thereof in the longitudinal direction, an open portion with an opening facing downward.

The groove portion may include a horizontal groove portion including opposite ends one of which is in communication with the air hole and extending in a horizontal direction from the air hole, and a vertical groove portion extending downward from the other of the opposite ends of the horizontal groove portion and including the open portion at a lower end thereof.

The sealing member may include a first section located lower than the air hole, a second section located higher than the air hole, a third section located on one of opposite sides of the air hole in the horizontal direction and connecting the first section and the second section, a fourth section extending downward from an end of the first section on the other of the opposite sides of the air hole in the horizontal direction, and a fifth section extending downward from an end of the second section on the other of the opposite sides of the air hole in the horizontal direction. The horizontal groove portion may be defined by the first section, the second section, and the third section. The vertical groove portion may be defined by the fourth section and the fifth section.

The groove portion may be a groove elongated vertically, the groove portion including an upper end portion in communication with the air hole, extending downward from the air hole, and including the open portion at a lower end thereof.

The sealing member may include a first portion located on one of opposite sides of the air hole in a horizontal direction, a second portion located on the other of the opposite sides of the air hole in the horizontal direction, and a third portion located higher than the air hole and connecting the first portion and the second portion. The groove portion may be defined by the first portion, the second portion, and the third portion.

The communication device may include a communication antenna contained in the casing in the vicinity of the air hole. The plate member may have a cutout in a portion corresponding to the communication antenna. The sealing member may include a section lying between the air hole and the cutout.

The waterproof structure may further include a cover to cover an opposite surface of the casing from a surface facing the plate member, the casing being housed in a space defined by the plate member and the cover.

The communication device may receive data from an information processor and include a communication antenna to transmit data. The communication device and the information processor may be attached to a mounting bracket such that the information processor is located on the same side of the communication device as a reverse surface of the communication device and is out of alignment with the communication antenna, the mounting bracket being a bracket for attachment of the communication device and the information processor to an object.

A communication unit according to an aspect of the present invention includes an information processor, a communication device to receive data from the information processor, the communication device including a communication antenna to transmit data, and a mounting bracket for attachment of the communication device and the information processor to an object, wherein the communication device and the information processor are attached to the mounting bracket such that the information processor is located on the same side of the communication device as a reverse surface of the communication device and is out of alignment with the communication antenna.

The communication unit may be configured such that the mounting bracket includes a plate member attached to the reverse surface of the communication device, the plate member has a cutout formed by cutting a portion corresponding to the communication antenna, and the information processor is located on an opposite surface of the plate member from a surface facing the reverse surface of the communication device and is out of alignment with the cutout.

The communication unit may be configured such that the communication device includes an electronic substrate including an obverse surface to which the communication antenna is attached, a casing housing the electronic substrate such that the obverse surface of the electronic substrate and an obverse surface of the communication device face in the same direction, and a positioning antenna to receive one or more satellite signals from one or more positioning satellites, the positioning antenna being attached to the obverse surface of the electronic substrate.

A working machine according to an aspect of the present invention includes a machine body to which any of the communication units is attached, wherein the communication device is positioned with an obverse surface thereof facing outward from the machine body.

The working machine may further include a cabin provided on the machine body and including a glass surface. The communication device may be located inside the cabin such that the obverse surface of the communication device faces toward the glass surface.

The working machine may further include an operator's seat, and a console located on one side of the operator's seat. The communication device may be located forward of the console. The mounting bracket may be attached to the console.

The console may include a meter at a front portion thereof. The communication device may be located diagonally forward and downward of the meter.

The working machine may further include a support bracket located on an opposite side of the console from the operator's seat and supporting a controller of the working machine. The mounting bracket may be attached to the support bracket.

The working machine may further include a tank located inside the cabin, and a tank stay supporting the tank. The mounting bracket may include a first bracket member to which the information processor and the communication device are attached and which is attached to the tank stay, and a second bracket member located on an opposite side of the first bracket member from the tank stay, having one of the opposite ends attached to the first bracket member, and having the other of the opposite ends attached to a wall portion of the cabin.

The above and other elements, features, steps, characteristics and advantages of the present invention will become more apparent from the following detailed description of the preferred embodiments with reference to the attached drawings.

BRIEF DESCRIPTION OF THE DRAWINGS

A more complete appreciation of preferred embodiments of the present invention and many of the attendant advantages thereof will be readily obtained as the same becomes better understood by reference to the following detailed description when considered in connection with the accompanying drawings described below.

DETAILED DESCRIPTION OF THE PREFERRED EMBODIMENTS

Figure 1:
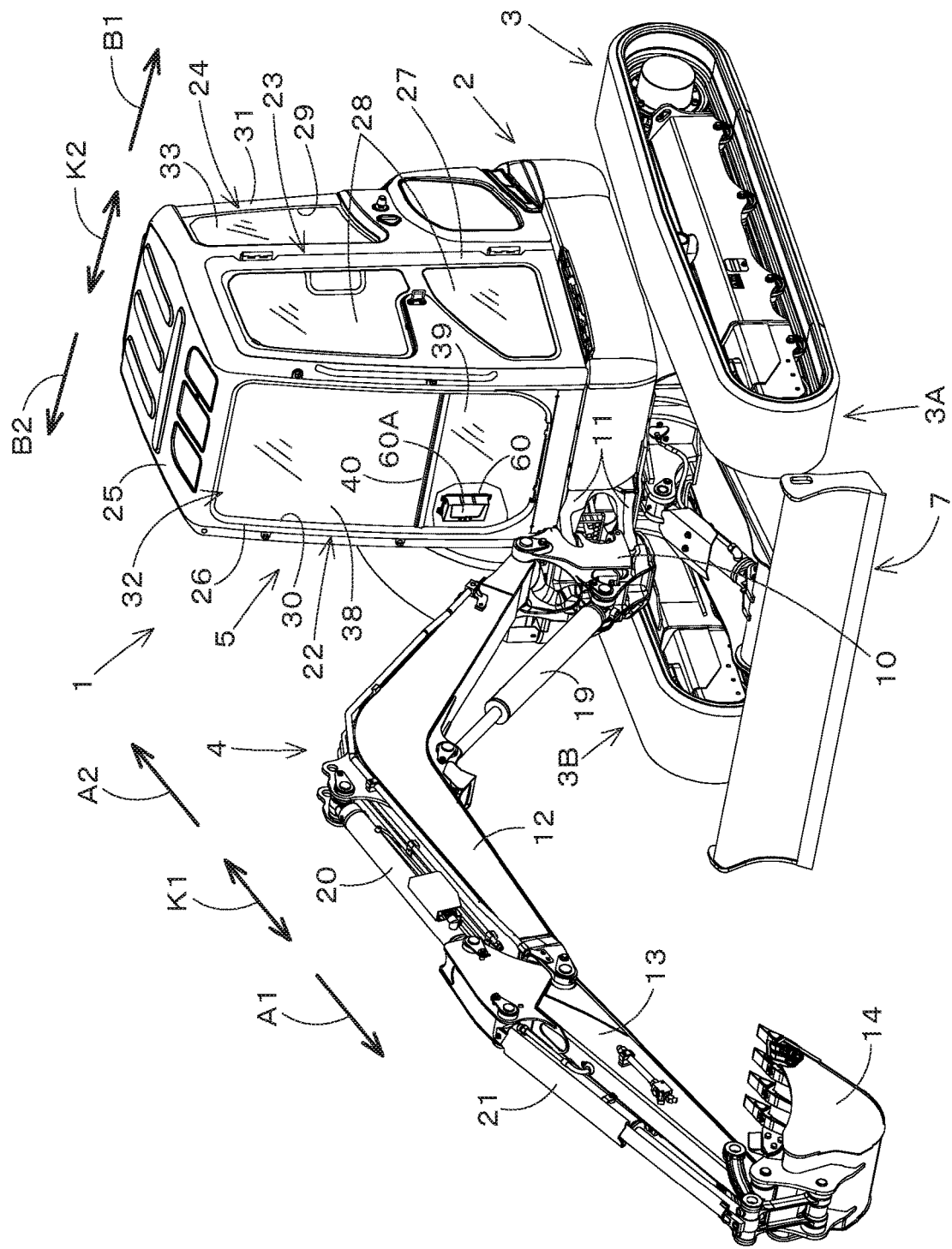
FIG. 1 is a perspective view of a working machine according to a first embodiment.

The preferred embodiments will now be described with reference to the accompanying drawings, wherein like reference numerals designate corresponding or identical elements throughout the various drawings. The drawings are to be viewed in an orientation in which the reference numerals are viewed correctly.

The following description discusses an embodiment of the present invention with reference to drawings as appropriate.

FIGS. 1 to 14 illustrate a first embodiment.

FIG. 1 is a perspective view of an overall configuration of a working machine 1 according to the present embodiment. In the present embodiment, a backhoe, which is a revolving working machine, is illustrated as an example of the working machine 1.

As illustrated in FIG. 1, the working machine 1 includes a machine body (swiveling base) 2, a traveling device 3, and a front working device (working device) 4. The machine body 2 is provided with a cabin 5.

In the present embodiment, as shown in FIG. 1, the direction of arrow A1 is referred to as a forward direction, the direction of arrow A2 is referred to as a rearward direction, and the direction of arrow K1 is referred to as a front-rear direction. The direction of arrow B1 is referred to as the leftward direction, the direction of arrow B2 is referred to as a rightward direction, and the direction of arrow K2 is referred to as a machine body width direction. The machine body width direction K2 is a horizontal direction orthogonal to the front-rear direction.

A direction rightward or leftward from the widthwise center of the machine body 2 is referred to as a machine body width outward direction. The opposite direction of the machine body width outward direction is referred to as a machine body width inward direction.

As illustrated in FIG. 1, the traveling device 3 is a crawler traveling device including a first crawler travel unit 3A provided on one of the opposite sides of the machine body 2 in the machine body width direction K2 (provided on the left side of the machine body 2), and a second crawler travel unit 3B provided on the other of the opposite sides of the machine body 2 in the machine body width direction K2 (provided on the right side of the machine body 2). The traveling device 3 supports the machine body 2 such that the machine body 2 is allowed to travel. The machine body 2 is supported on the traveling device 3 such that the machine body 2 is rotatable about the vertical axis (axis extending in the up-and-down direction). A blade implement 7 is attached to a front portion of the traveling device 3.

As illustrated in FIG. 1, the front working device 4 is located on a front portion of the machine body 2 in front of the cabin 5. The front working device 4 is supported on a swing bracket 10 such that the front working device 4 is swingable up and down. The swing bracket 10 is supported on a support bracket 11 such that the swing bracket 10 is rotatable about the vertical axis. The support bracket 11 is fixed to the machine body 2 and projects forward from the machine body 2.

The front working device 4 includes a boom 12, an arm 13, and a working tool (bucket) 14. The boom 12 has its proximal portion pivotably supported on an upper portion of the swing bracket 10. The arm 13 has its proximal portion pivotably supported on a distal portion of the boom 12. The working tool 14 is pivotably supported on a distal portion of the arm 13.

The front working device 4 also includes a boom cylinder 19 to drive the boom 12, an arm cylinder 20 to drive the arm 13, and a working tool cylinder 21 to drive the working tool 14. The boom cylinder 19, the arm cylinder 20, and the working tool cylinder 21 are each formed of a hydraulic cylinder.

As illustrated in FIG. 1, the cabin 5 includes a front window 22 on its front surface, an entrance/exit door 23 in a front portion of its left surface, a side window 24 in a rear portion of the left surface, and a roof 25 on its top surface. The front window 22 includes a glass (front glass) 32 fitted within a window frame 26 defining a window opening 30 to close the window opening 30. The front glass 32 includes an upper pane 38 provided in an upper portion of the window opening 30, a lower pane 39 provided in a lower portion of the window opening 30, and a sealing part 40 which achieves sealing between the upper pane 38 and the lower pane 39. The entrance/exit door 23 includes glass panes (door glass) 28 in upper and lower portions of a door frame 27. The side window 24 is provided rearward of the entrance/exit door 23, specifically, the side window 24 is provided rearward of an upper portion of the entrance/exit door 23. The side window 24 includes a glass (side glass) 33 fitted within a window frame 31 defining a window opening 29 to close the window opening 29. Note that the cabin 5 includes a rear window on its rear surface, and a side window (right side window) on its right surface. The rear window and the right side window also include a glass fitted within a window frame defining a window opening to close the window opening. The glasses on the forward, rear, left, and right surfaces of the cabin 5 are transparent to light.

Figure 2:
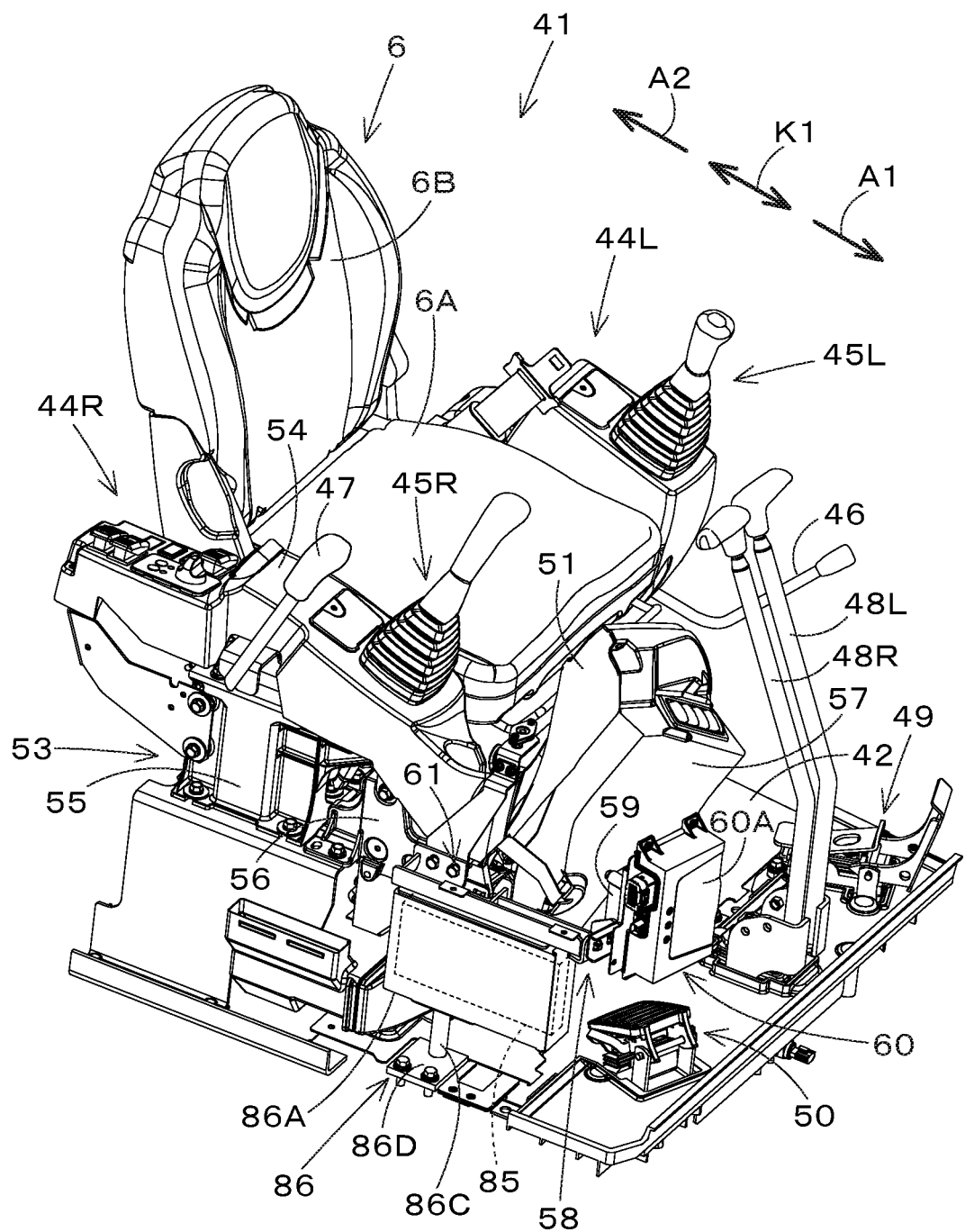
FIG. 2 is a perspective view of an operator section.
Figure 3:
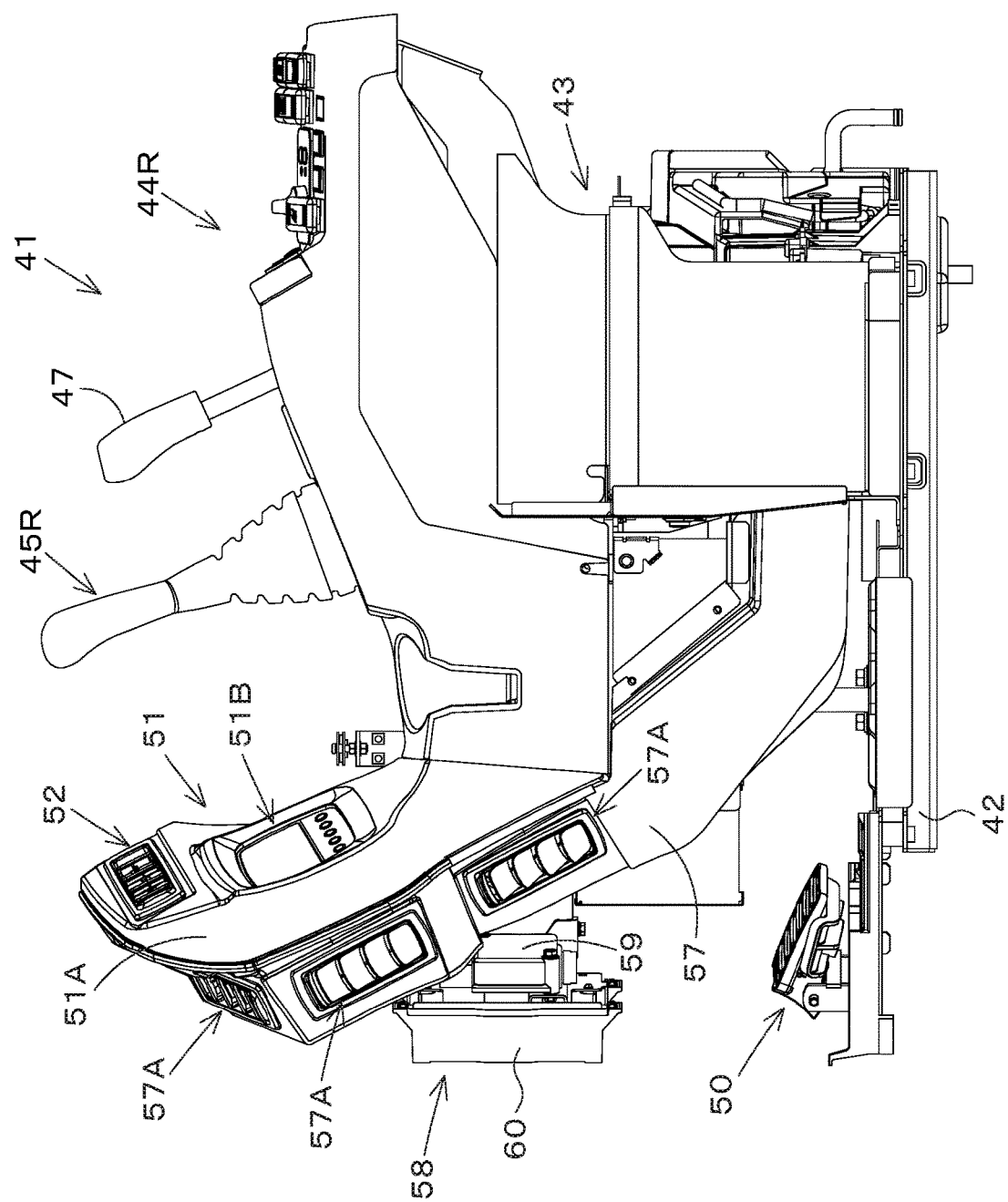
FIG. 3 is a side view of a right console.

FIG. 2 illustrates an operator section 41 including an operator's seat 6 for an operator (driver) to be seated. The operator section 41 is located within the interior of the cabin 5 (inside the cabin 5). The operator section 41 includes a floor 42 attached to the machine body 2. As illustrated in FIG. 3, the operator section 41 includes a seat base 43 for attachment of the operator's seat 6, and the seat base 43 is attached to the floor 42. As illustrated in FIG. 2, the operator's seat 6 includes a seat 6A to support the bottom of the operator and a backrest 6B to support the back of the operator. The operator seated on the operator's seat 6 faces in the forward direction A1.

As illustrated in FIG. 2, the operator section 41 includes a left console 44L, a right console 44R, a left manual operator 45L, and a right manual operator 45R. The console 44L is located leftward of the operator's seat 6, and the console 44R is located rightward of the operator's seat 6. The console 44L includes an unloading lever 46 and the manual operator 45L. The unloading lever 46 is swingable upward from the position as illustrated in FIG. 2. When the unloading lever 46 is in an upward swung position, hydraulic fluid is not allowed to be supplied to hydraulic device(s). The console 44R includes switches, the manual operator 45R, and a blade lever 47 for operation of the blade implement 7. The manual operator 45L and the manual operator 45R can each be used to operate two objects. For example, the manual operator 45L can be used to cause the machine body 2 to rotate and to cause the arm 13 to swing. The manual operator 45R can be used to cause the boom 12 to swing and to cause the working tool 14 to swing.

As illustrated in FIG. 2, the operator section 41 includes two traveling levers 48L and 48R located forward of the operator's seat 6. The two traveling levers 48L and 48R are arranged along the machine body width direction K2. The left traveling lever 48L can be used to operate the first crawler travel unit 3A, and the right traveling lever 48R can be used to operate the second crawler travel unit 3B. An SP pedal 49 is located leftward of the traveling levers 48L and 48R, and a swing pedal 50 is located rightward of the traveling levers 48L and 48R. The SP pedal 49 is an operation member for operation of a working tool equipped with a hydraulic actuator. The swing pedal 50 is an operation member for operation of a hydraulic cylinder to cause the swing bracket 10 to swing.

As illustrated in FIG. 3, the console 44R includes, in a front portion thereof, a meter 51 extending such that the meter 51 is inclined upward in the forward direction. The meter 51 includes a meter cover 51A and a display portion (including a liquid crystal screen and/or the like) 51B provided on the back surface of the meter cover 51A. The meter cover 51A has, in an upper portion thereof, an air outlet 52 through which conditioned air from an air conditioner is discharged. The display portion 51B is oriented toward the operator seated on the operator's seat 6. The display portion 51B is capable of displaying, for example, basic information about the working machine 1, images of a surrounding area of the working machine 1, information for use in making various settings on the working machine 1, and/or the like.

As illustrated in FIG. 2, the console 44R includes a console frame 53 supporting the switches, the manual operator 45R, the blade lever 47, a console cover 54, and the meter 51 of the console 44R. The console frame 53 is attached to the seat base 43. Accordingly, the console frame 53 (console 44R) is fixed to the machine body 2 via the seat base 43 and the floor 42. The console frame 53 includes a rear frame 55 constituting a rear portion and a front frame 56 constituting a front portion.

Figure 4:
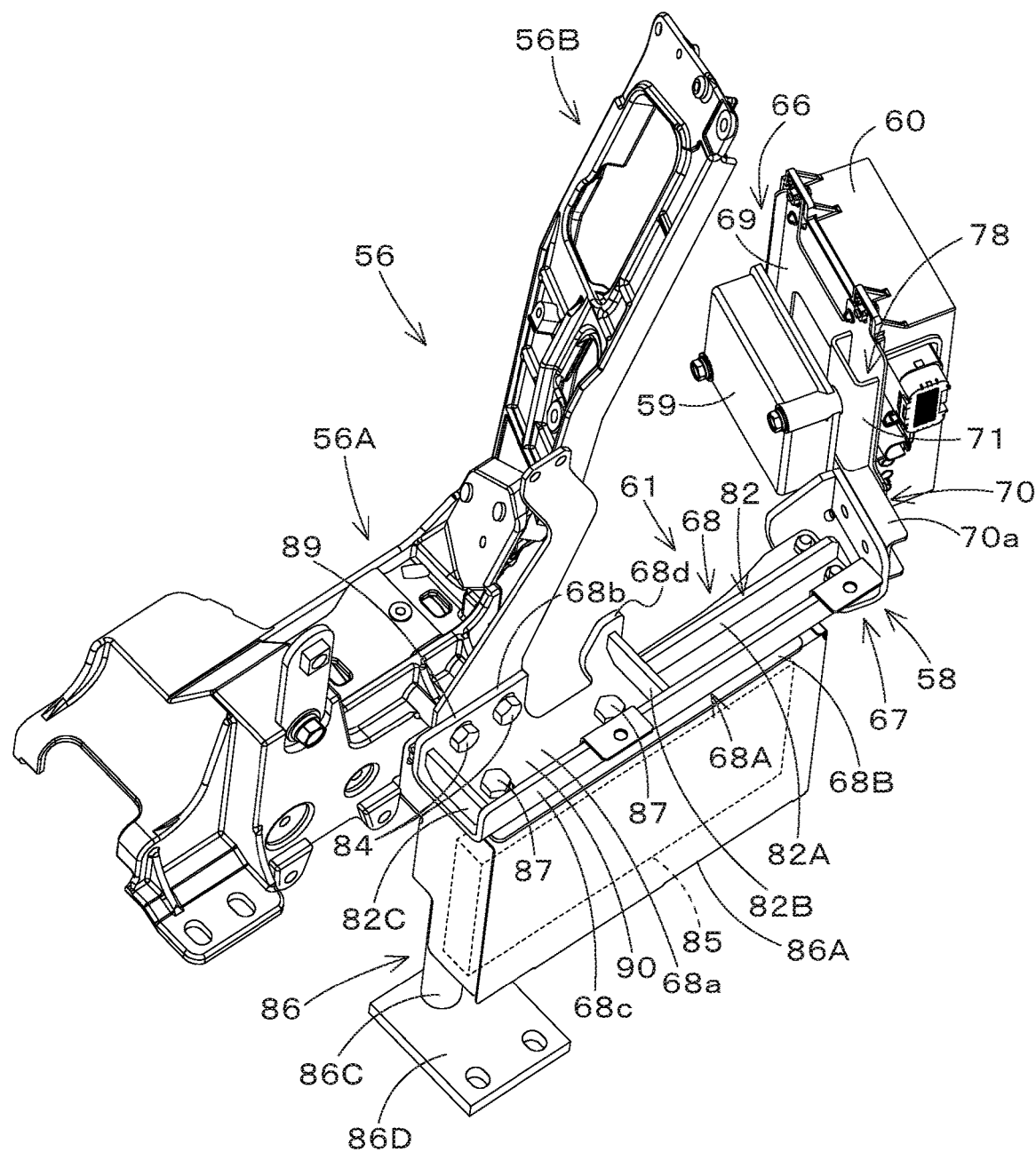
FIG. 4 is a top perspective view illustrating how a communication unit is arranged and attached.
Figure 5:
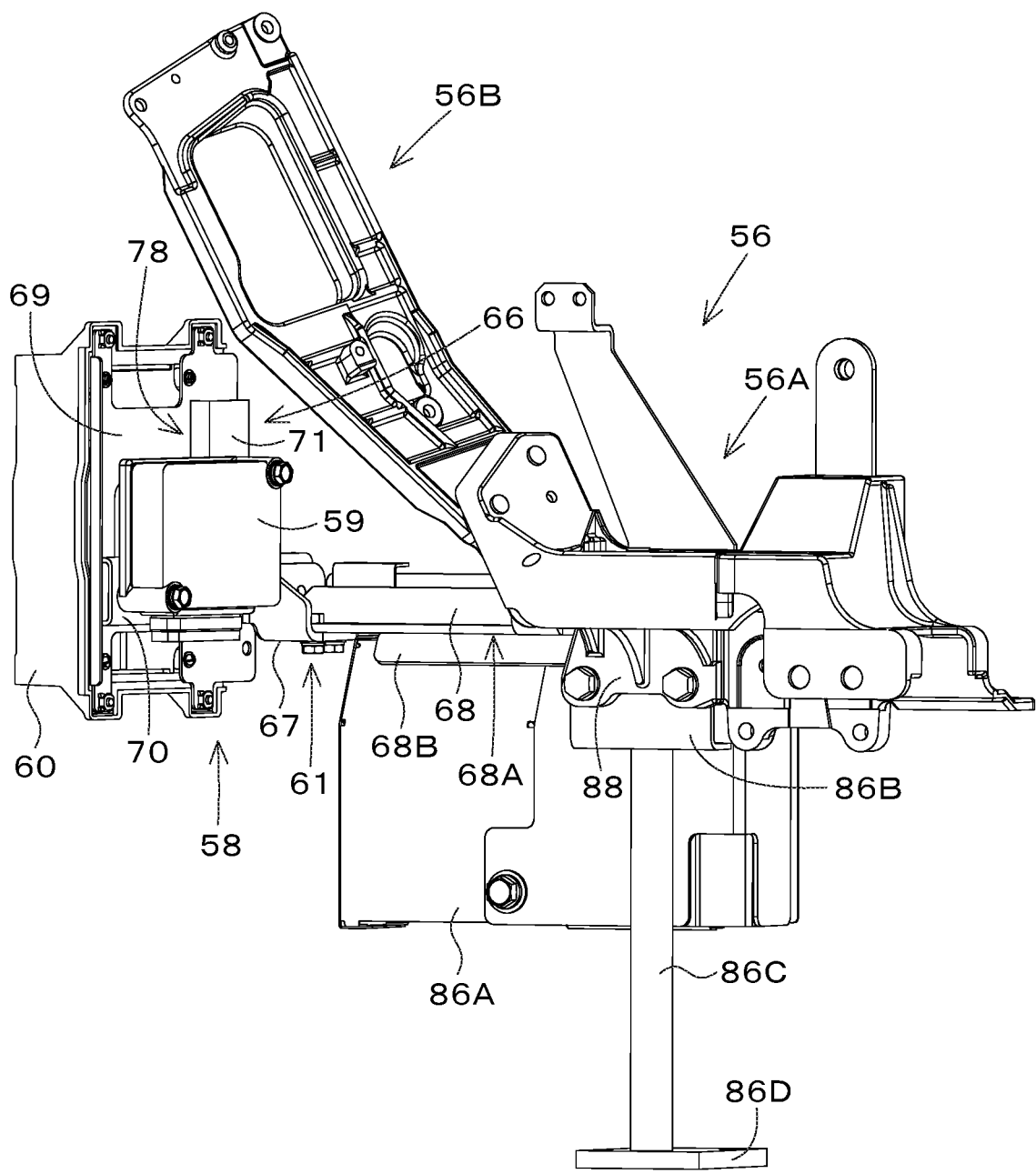
FIG. 5 is a side perspective view illustrating how the communication unit is arranged and attached.
Figure 6:
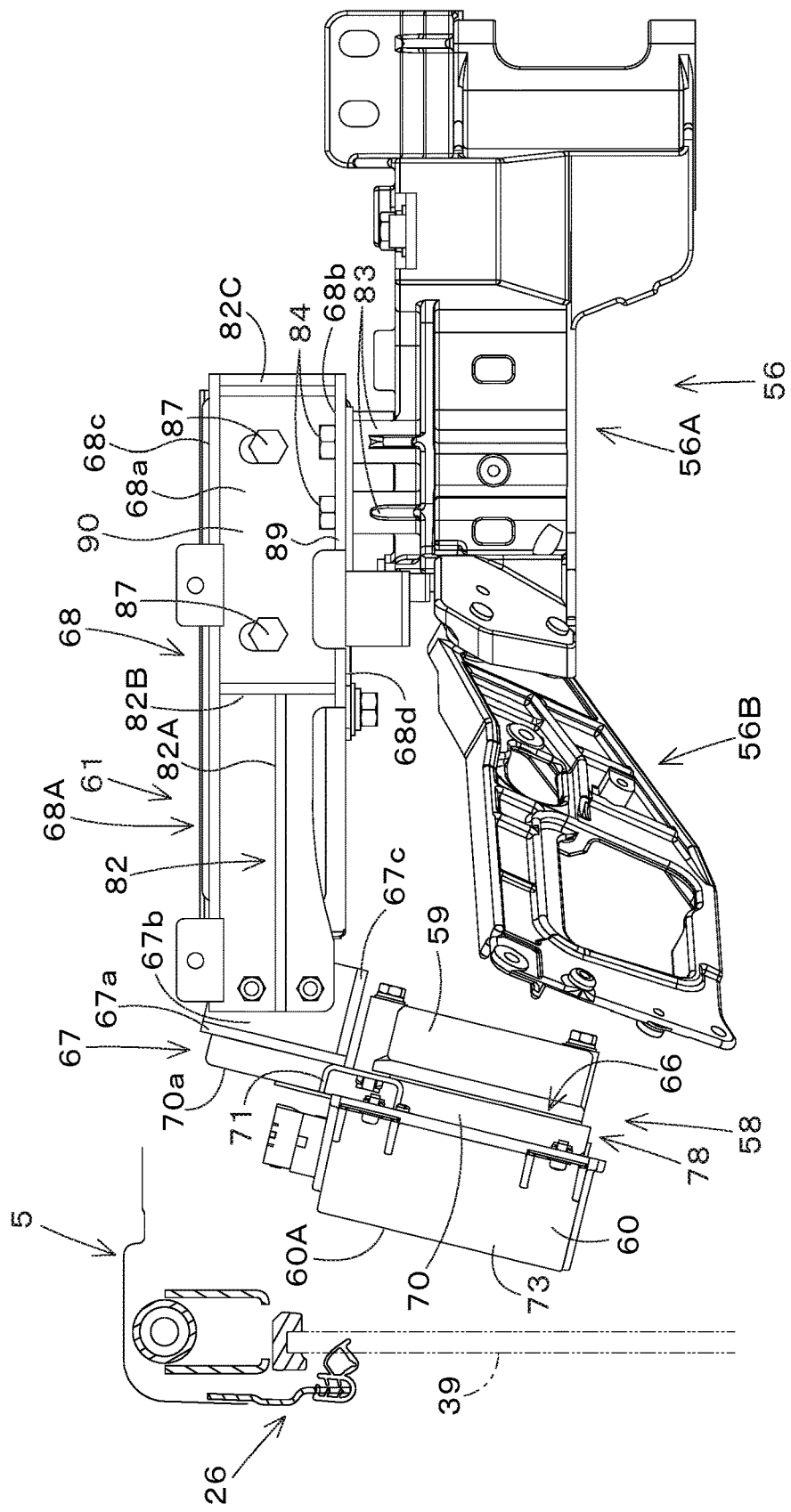
FIG. 6 is a plan view illustrating how the communication unit is arranged and attached.

As illustrated in FIGS. 4, 5, and 6, the front frame 56 includes a main frame 56A and a meter frame 56B attached to a front portion of the main frame 56A. The meter frame 56B has attached thereto the meter cover 51A and the display portion 51B.

As illustrated in FIG. 3, an air duct 57 for circulation of conditioned air is located forward of the meter 51. The air duct 57 extends from the main body of an air conditioner provided inside the seat base 43 to the front surface of the meter 51. The air duct 57 has the air outlet 57A through which conditioned air is discharged.

As illustrated in FIG. 2, the operator section 41 includes a communication unit 58. The communication unit 58 is located at or near an outer periphery of the operator section 41. In the present embodiment, the communication unit 58 is provided inside the cabin 5 at a front-right portion of the machine body 2 (operator section 41).

As illustrated in FIGS. 4, 5, and 6, the communication unit 58 is a unit including an information processing unit (IPU) 59, a direct communication unit (DCU) 60, and a mounting bracket 61 for attachment of the IPU 59 and the DCU 60 to a portion on the machine body 2 side.

Figure 7:
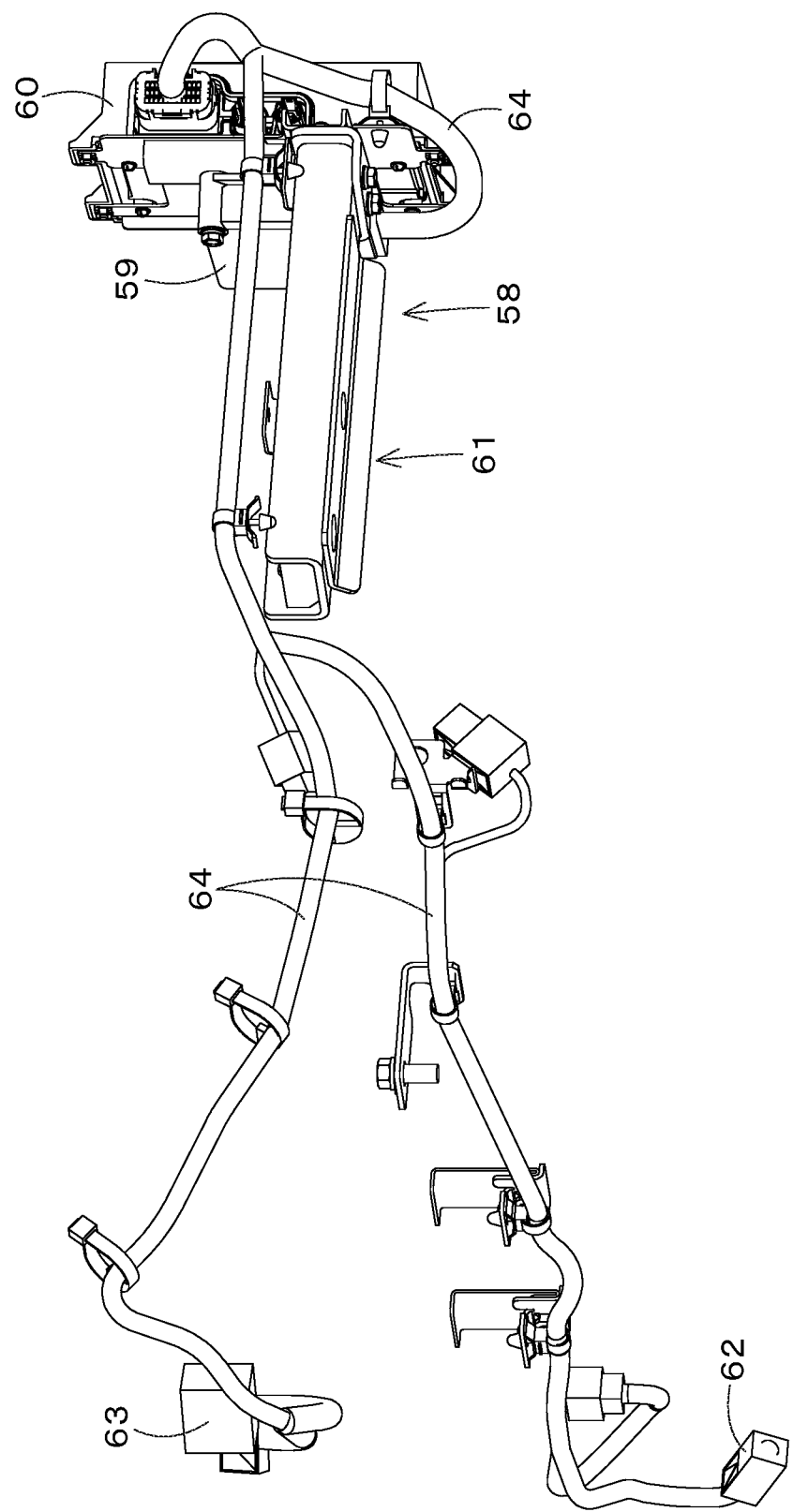
FIG. 7 is a perspective view of a structure to guide a harness of the communication unit.

The IPU 59 is an "information processor" which temporarily stores information relating to the working machine 1 and performs predetermined processing (for example, compression). As illustrated in FIG. 7, the IPU 59 is connected to a communication port 62 of an in-vehicle communication network (not illustrated) via a wire harness 64, and transmits and receives information relating to the working machine 1 through the communication network. The in-vehicle communication network is a controller area network (CAN), FlexRay, and/or the like on the working machine 1. The IPU 59 is connected to the DCU 60 via the wire harness 64, and transmits data to the DCU 60.

The DCU 60 is a "communication device" which exchanges data with external device(s) (not illustrated). The DCU 60 receives data from the IPU 59. The DCU 60 transmits, to a server, the data received from the IPU 59 and data such as position information. The server is, for example, a server located at a manufacturer of the working machine 1, a server located at a dealer which sells the working machine 1 and provides maintenance services for the working machine 1, and/or the like.

The IPU 59 and the DCU 60 are connected to a power supply port 63 via the wire harness 64, and are supplied with power from the power supply port 63. The communication port 62 and the power supply port 63 are located in the operator section 41.

As illustrated in FIG. 1, the DCU 60 is located at or near the outer periphery of the operator section 41 such that an obverse surface 60A thereof faces outward from the machine body 2 (faces in an outward direction from the machine body). In the present embodiment, as illustrated in drawings such as FIG. 6, the DCU 60 is positioned such that the obverse surface 60A thereof faces forward.

Figure 8:
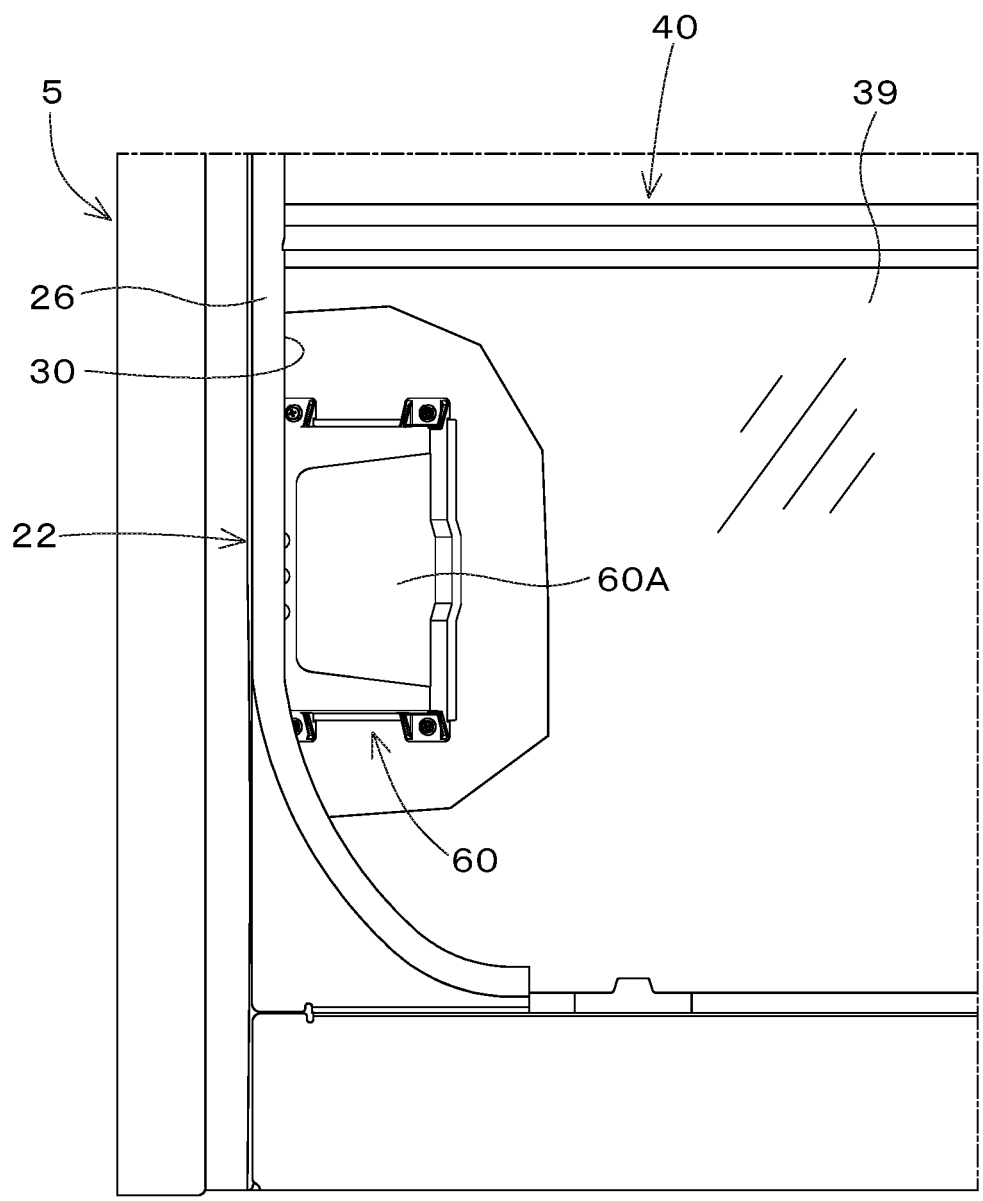
FIG. 8 is a front view of a part of a cabin.

As illustrated in FIGS. 2 and 3, the DCU 60 and the IPU 59 are located forward of the console 44R. Specifically, the DCU 60 and the IPU 59 are located diagonally forward and downward of the meter 51 and the air duct 57. Since the DCU 60 and the IPU 59 are located diagonally forward and downward of the meter 51 and the air duct 57, it is possible to eliminate or reduce the likelihood that the DCU 60 and the IPU 59 will interfere with the operator's view. As illustrated in FIGS. 6 and 8, the DCU 60 is located inside the cabin 5 such that the obverse surface 60A thereof faces toward a glass surface of the cabin 5. Specifically, the DCU 60 is located inside the cabin 5 such that the obverse surface 60A thereof faces toward the lower pane 39 of the front window 22. In particular, the DCU 60 is located inside the cabin 5 near the lower pane 39 such that the obverse surface 60A thereof faces forward and that the DCU 60 protrudes in the machine body width inward direction from the right edge of the window opening 30 of the front window 22 (see FIG. 8).

As illustrated in FIG. 8, the DCU 60 is substantially in the form of a rectangular parallelepiped with the obverse surface 60A thereof substantially in the form of a rectangle, and is positioned upright such that the longitudinal direction of the rectangular parallelepiped matches the up-and-down direction. As illustrated in FIG. 2, the DCU 60 is located above the floor 42 of the operator section 41 with a space therebetween, and, as illustrated in FIG. 6, is positioned such that the DCU 60 is inclined forward in the machine body width inward direction (leftward direction). As illustrated in FIG. 2, the swing pedal 50 is provided on a front-right portion of the floor 42. The DCU 60 is located near the swing pedal 50. Since the DCU 60 is located above the floor 42 with a space therebetween and is diagonally positioned, the DCU 60 is prevented from interfering with the movement of the operator's foot to operate the swing pedal 50.

As illustrated in FIGS. 4, 5, and 6, the IPU 59 is located on the same side of the DCU 60 as the reverse surface of the DCU 60, i.e., located on the opposite side of the DCU 60 from the side where the obverse surface 60A is located (located rearward of the DCU 60 in the first embodiment).

As illustrated in FIGS. 4, 5, and 6, the mounting bracket 61 includes a first bracket member 66, a second bracket member 67, and a third bracket member 68.

Figure 9A:
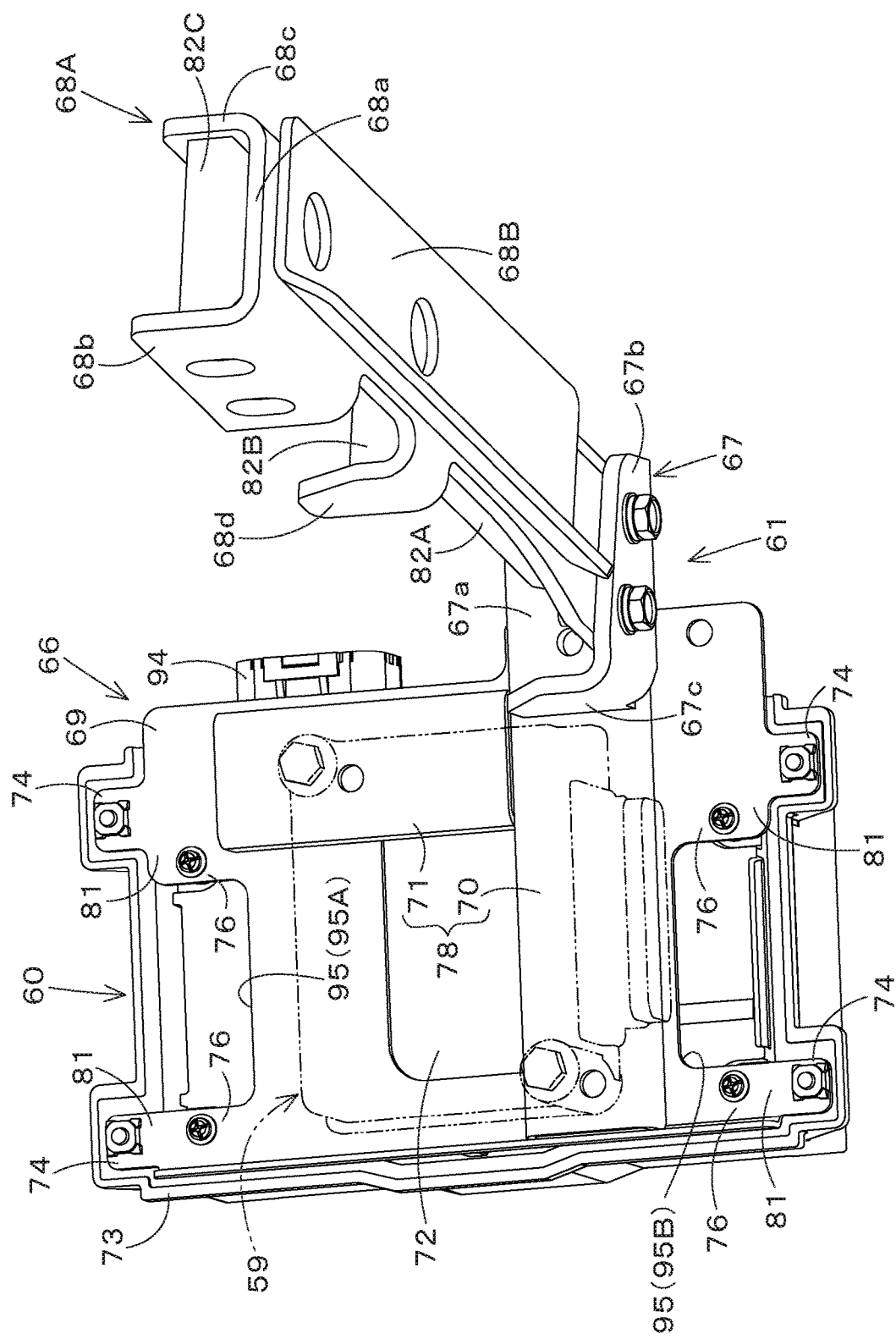
FIG. 9A is a reverse perspective view of the communication unit.
Figure 9B:
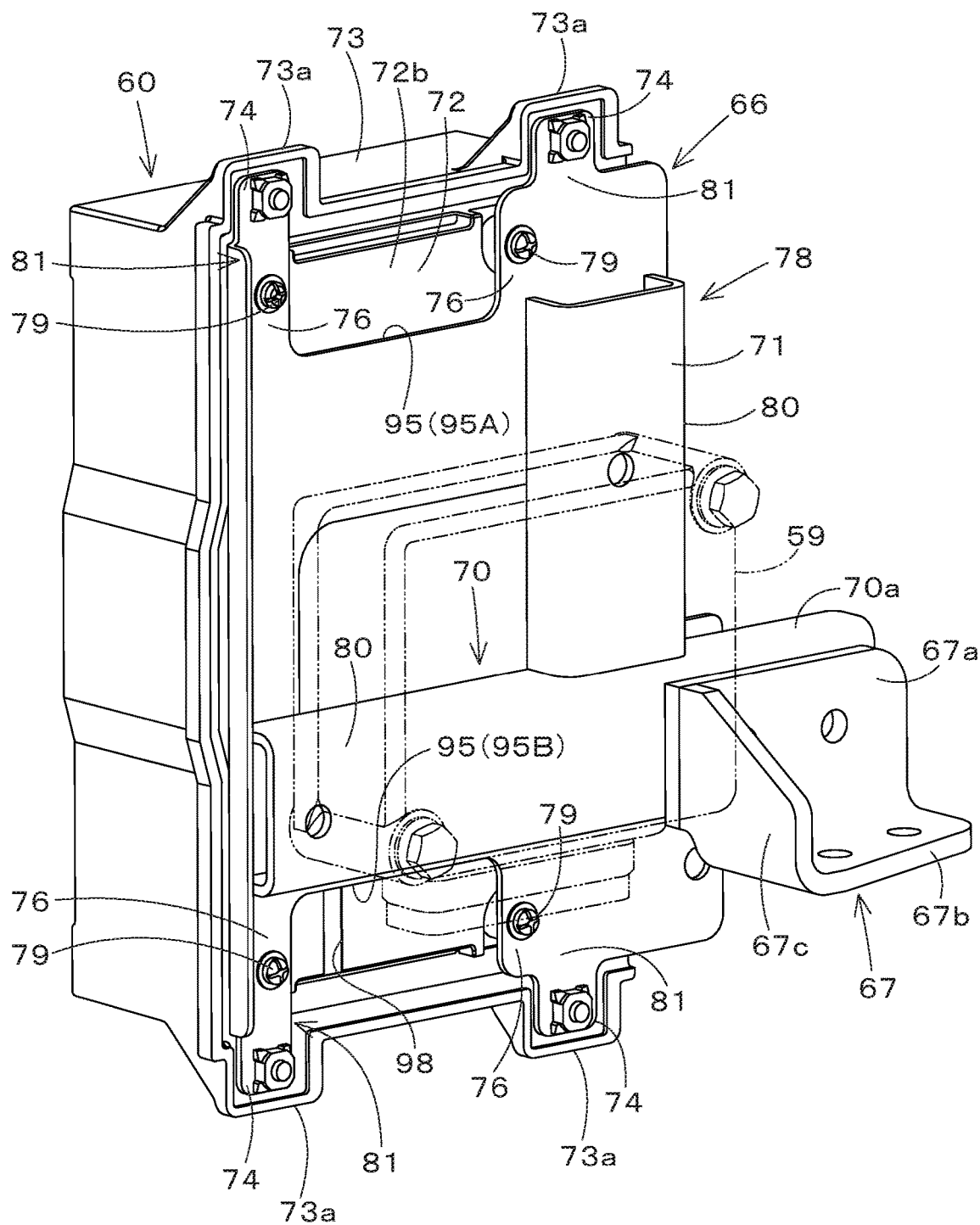
FIG. 9B is a reverse perspective view of the communication unit.

As illustrated in FIG. 9B, the DCU 60 and the IPU 59 are attached to the first bracket member 66. Specifically, as illustrated in FIG. 9A, the first bracket member 66 includes a first device mount 69 for attachment of the DCU 60 and a second device mount 78 for attachment of the IPU 59.

Figure 10:
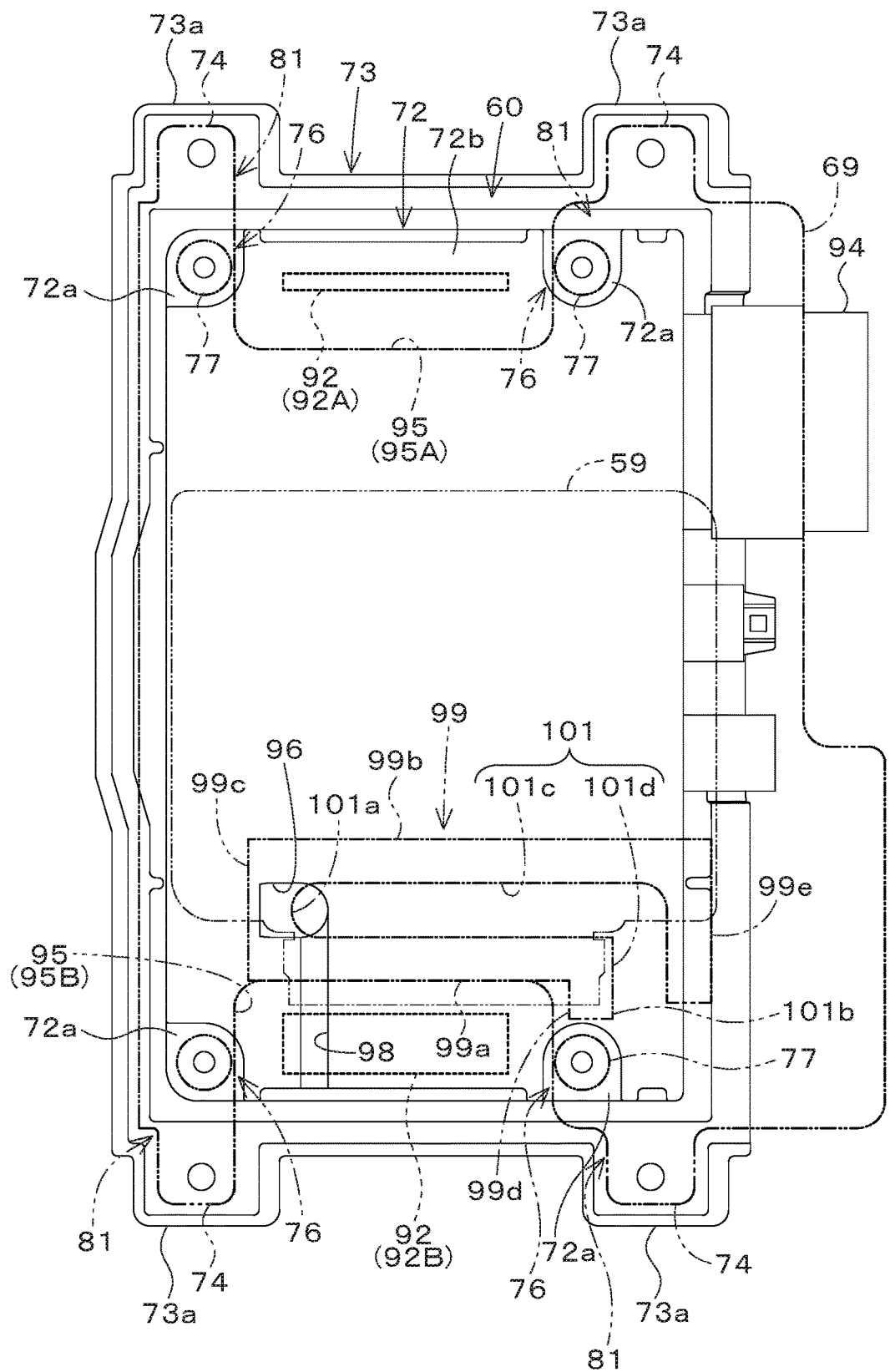
FIG. 10 is a reverse view of a communication device.
Figure 11:
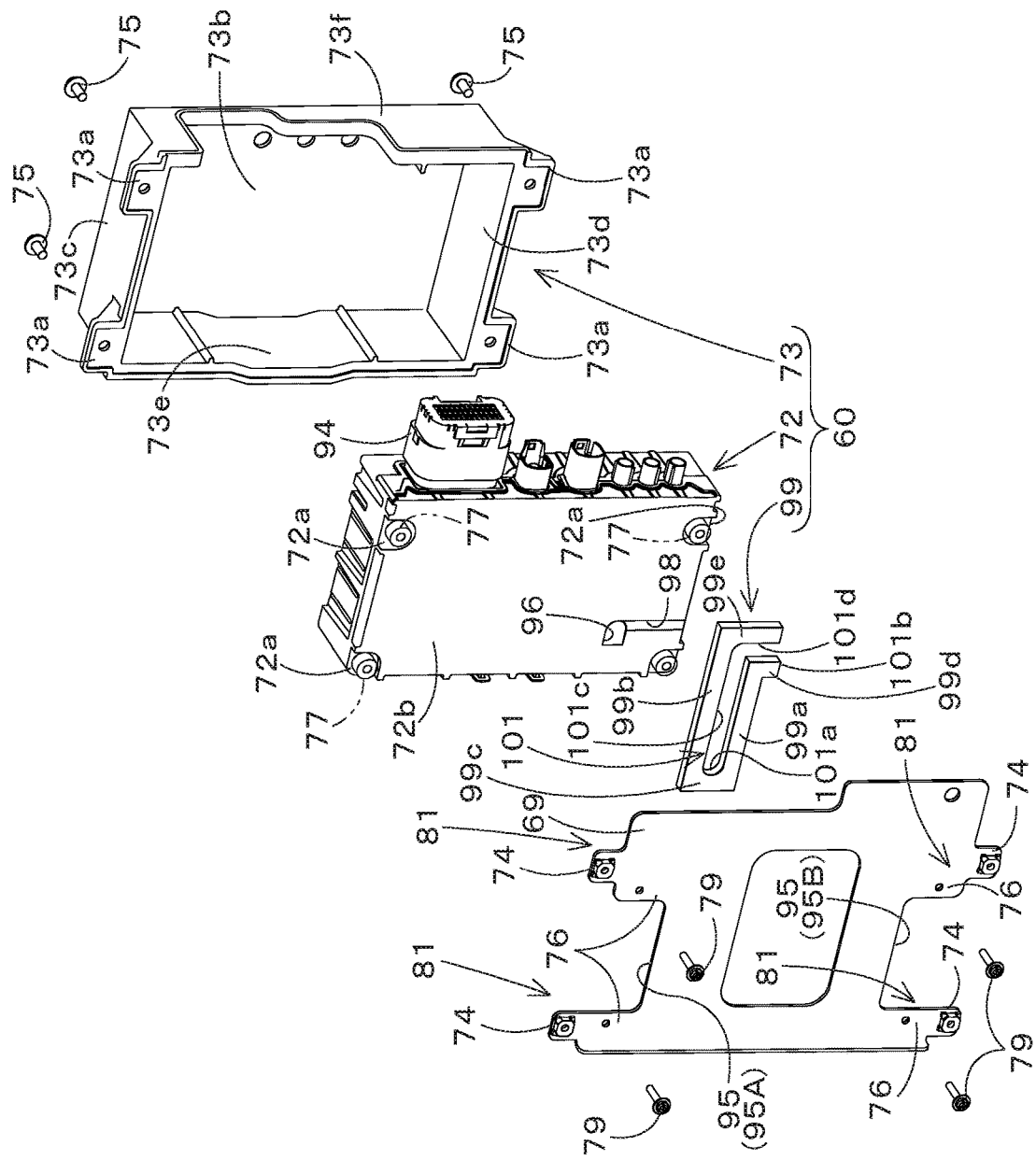
FIG. 11 is an exploded perspective view of the communication device and other components.

The first device mount 69 is, for example, a plate member formed of a metal plate. The first device mount 69 is hereinafter referred to as a plate member. The plate member 69 is attached to the reverse surface of the DCU 60. Specifically, as illustrated in FIGS. 10 and 11, the DCU 60 includes a casing 72 and a cover 73 which covers the casing 72 on the obverse surface 60A side. The plate member 69 includes a plurality of cover attachment portions 74. The plurality of cover attachment portions 74 are located at the upper left, upper right, lower left, and lower right portions of the plate member 69. The cover attachment portions 74 have attached thereto attachment pieces 73a at four corners of the cover 73 with bolts 75 and/or the like (see FIG. 11).

The plate member 69 includes a plurality of casing attachment portions 76. The casing attachment portions 76 are located at the upper left, upper right, lower left, and lower right portions of the plate member 69. Attachment recessed portions 72a at four corners of the casing 72 are attached to the casing attachment portions 76 with bolts 79 and/or the like. Spacer members 77 provided in the attachment recessed portions 72a are fixed to surfaces of the respective casing attachment portions 76 of the plate member 69 that face in the same direction as the obverse surface 60A. Thus, the plate member 69 is attached to the attachment recessed portions 72a via the spacer members 77.

As illustrated in FIGS. 9A and 9B, the second device mount 78 includes a first member 70 and a second member 71. The first member 70 and the second member 71 are each formed of channel steel.

The first member 70 is positioned sideways (extends in a horizontal direction) such that its open side faces the plate member 69 (faces forward), and is fixed to a lower portion of the reverse surface of the plate member 69. The first member 70 includes a projecting portion 70a which projects rightward from the plate member 69. The second member 71 is positioned upright (extends in the up-and-down direction) such that its open side faces the plate member 69 (faces forward), and is fixed to an upper right portion of the reverse surface of the plate member 69. The second member 71 has its lower end fixed to the first member 70. The IPU 59 is attached a left portion of the first member 70 and an intermediate portion of the second member 71 with fastener(s) such as bolts(s).

As illustrated in FIG. 9B, the left portion of the first member 70 and the intermediate portion of the second member 71 (to which the IPU 59 is attached) constitute an attachment portion (first attachment portion) 80 for attachment of the IPU 59. The cover attachment portions 74 and the casing attachment portions 76 constitute an attachment portion (second attachment portion) 81 for attachment of the DCU 60. That is, the mounting bracket 61 includes the first attachment portion 80 for attachment of the IPU 59 and the second attachment portion 81 for attachment of the DCU 60.

As illustrated in FIGS. 6 and 9B, the second bracket member 67 includes a first wall 67a attached to the projecting portion 70a of the first member 70, a second wall 67b extending rearward from a lower end of the first wall 67a, and a third wall 67c extending upward from a left end of the second wall 67b and fixed to the first wall 67a.

As illustrated in FIGS. 4, 6, and 9A, the third bracket member 68 projects rearward from the second bracket member 67, and has its rear portion located on one side (on the right side) of the front frame 56. The third bracket member 68 includes a main member 68A, a rest member 68B, and a reinforcing member 82. The main member 68A includes a bottom wall portion 68a, a first side wall portion 68b, a second side wall portion 68c, and an upward-extending wall 68d. The bottom wall portion 68a has its front portion fixed to the second wall 67b of the second bracket member 67 with bolt(s). The bottom wall portion 68a projects rearward from the second wall 67b. The bottom wall portion 68a is attached to a cover member 86A of a support bracket 86 (described later) with bolt(s) 87. The first side wall portion 68b extends upward from a left edge of a rear portion of the bottom wall portion 68a. The first side wall portion 68b is fixed to attachment portion(s) 83 of the main frame 56A of the front frame 56 with bolt(s) 84 (see FIG. 6). The second side wall portion 68c extends upward from a right edge of the bottom wall portion 68a. The upward-extending wall 68d extends upward from an intermediate portion of the left edge of the bottom wall portion 68a in the front-rear direction K1.

As illustrated in FIG. 9A, the rest member 68B is formed of a plate member, is fixed to a lower surface of the bottom wall portion 68a, and is placed on the cover member 86A.

The reinforcing member 82 includes a first reinforcing plate 82A, a second reinforcing plate 82B, and a third reinforcing plate 82C. The first reinforcing plate 82A extends in the front-rear direction K1 from a front portion to an intermediate portion of the bottom wall portion 68a in the front-rear direction K1 and also extends upward from an upper surface of the bottom wall portion 68a. The second reinforcing plate 82B is fixed to a rear end of the first reinforcing plate 82A and bridges the gap between the upward-extending wall 68d and the second side wall portion 68c. The third reinforcing plate 82C connects the first side wall portion 68b and the second side wall portion 68c.

As illustrated in FIG. 2, the support bracket 86 to support a controller 85 (for example, an engine electric control unit (engine ECU) to control the prime mover) of the working machine 1 is located below the bottom wall portion 68a. The support bracket 86 is located on the opposite side of the console 44R from the operator's seat 6. In the present embodiment, the support bracket 86 is located rightward of the console 44R.

As illustrated in FIG. 5, the support bracket 86 includes the cover member 86A which covers the controller 85 and which is for attachment of the controller 85, a stay member 86B fixed to the cover member 86A, a support member 86C to support the stay member 86B, and a base member 86D fixed to a lower end of the support member 86C. The cover member 86A has, fixed thereto with bolt(s), a rear portion of the bottom wall portion 68a (see FIG. 4). The stay member 86B is fixed to an attachment portion 88 of the main frame 56A of the front frame 56 with bolt(s). The base member 86D is attached to the machine body 2. That is, the support bracket 86 is attached to the machine body 2.

The first side wall portion 68b constitutes an attachment portion (third attachment portion) 89 for attachment of the mounting bracket 61 to the console 44R. The rear portion of the bottom wall portion 68a constitutes an attachment portion (fourth attachment portion) 90 for attachment of the mounting bracket 61 to the support bracket 86. That is, the mounting bracket 61 includes the third attachment portion 89 attached to the console 44R and the fourth attachment portion 90 attached to the support bracket 86. In other words, the mounting bracket 61 is attached to a portion on the machine body 2 side.

In the present embodiment, the mounting bracket 61 is configured to be attached to the console 44R and the support bracket 86, and therefore the communication unit 58 (a unit including the DCU 60, the IPU 59, and the mounting bracket 61) can be attached as an add-on to the working machine 1 including the console 44R and the support bracket 86. Furthermore, because it is possible to mount, on the machine body 2, the communication unit 58 which is an assembly of the DCU 60 and the IPU 59 attached on the mounting bracket 61, it is possible to easily do the work of attaching the communication unit 58 (the DCU 60 and the IPU 59). The DCU 60 and the IPU 59 are provided on the machine body 2 such that the IPU 59 is located on the same side of the DCU 60 as the reverse surface of the DCU 60, making it possible to arrange the DCU 60 and the IPU 59 in a compact manner.

The following description discusses a structure of the DCU 60 and a waterproof structure in detail.

Figure 14:
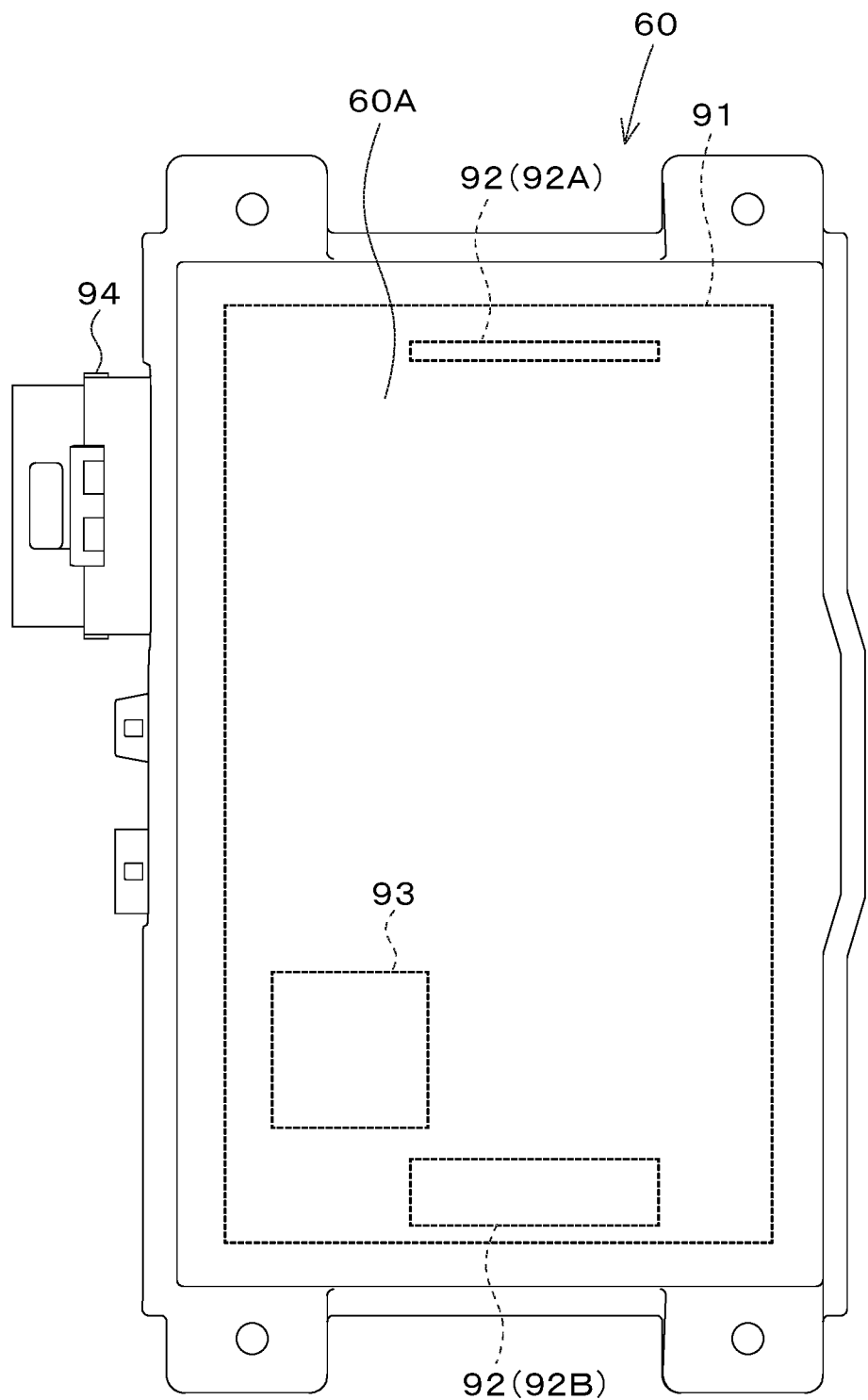
FIG. 14 is an obverse view of the communication device.

As illustrated in FIG. 14, the DCU 60 includes an electronic substrate 91 housed in the casing 72. As illustrated in FIG. 11, the casing 72 is substantially in the form of a rectangular parallelepiped, and is divided in two parts one of which is on the obverse surface 60A side and the other of which is on the DCU's reverse surface side. As illustrated in FIG. 14, the electronic substrate 91 has one or more communication antennas (3G antennas) 92 and a positioning antenna (GPS antenna) 93 on its obverse surface for attachment of electronic components. The electronic substrate 91 is housed in the casing 72 such that its obverse surface and the obverse surface 60A of the DCU 60 face in the same direction. The communication antennas 92 communicate with a server, and are located on an upper portion and a lower portion of the electronic substrate 91. The communication antennas 92 are contained in the DCU 60.

It is noted that, if the communication antennas 92 were attached to the working machine 1 separately from the main body of the DCU 60, disconnection of the harness connecting the main body of the DCU 60 and the communication antennas 92 would prevent a notification from being sent to an external device (such as a server) in case of theft of the DCU 60. However, with the communication antennas 92 contained in the DCU 60, it is possible to keep communication possible even during unlawful acts such as stealing of the DCU 60 (such as the act of detaching the DCU 60), and thus possible to send a notification to a certain recipient.

The positioning antenna 93 receives one or more satellite signals from one or more positioning satellites. The positioning antenna 93 is located on a lower right portion of the electronic substrate 91. The working machine 1 detects the position thereof (measured position information including latitude and longitude) based on the satellite signals received by the positioning antenna 93 using a positioning system. Specifically, the working machine 1 uses a well-known Global Positioning System (GPS) which is an example of Global Navigation Satellite Systems (GNSS) (for example, uses RTK-GPS suitable for positioning mobile objects) to determine the position and heading of the working machine 1. That is, the working machine 1 communicates with a base station (reference station) located at a known position, and the base station transmits, to the working machine 1, positioning data (correction information) obtained by receiving radio waves from the positioning satellites. The working machine 1 detects the position thereof (latitude, longitude) based on positioning data obtained by receiving radio waves from the positioning satellites and the positioning data received from the base station. The DCU 60 receives and transmits position information.

As illustrated in FIGS. 11 and 14, a connector 94 for connection of the wire harness 64 is provided on an upper right portion of the DCU 60.

As illustrated in FIG. 11, the cover 73 is made of resin, and includes an obverse wall 73b covering the obverse surface 60A side of the casing 72, an upper wall 73c covering an upper surface of the casing 72, a lower wall 73d covering a lower surface of the casing 72, a first side wall 73e covering a side surface (left surface) of the casing 72, and a second side wall 73f covering the opposite side surface (right surface) of the casing 72. The cover 73 covers the opposite surface of the casing 72 from the surface facing the plate member 69. The plate member 69 covers a reverse surface (one surface) 72b of the casing 72 defining the reverse side of the DCU 60. Thus, the cover 73 and the plate member 69 together house the casing 72.

As illustrated in FIG. 10, the plate member 69 has cutouts 95 obtained by cutting portions corresponding to the communication antennas 92. Specifically, the plate member 69 has a cutout 95A corresponding to a communication antenna 92A in an upper portion thereof and has a cutout 95B corresponding to a communication antenna 92B in a lower portion thereof. The communication antennas 92 have higher sensitivity in the thickness direction of the electronic substrate 91. The cover 73 is made of resin and the plate member 69 has cutouts in portions corresponding to the communication antennas 92, making it possible to avoid interference with the radio wave directivity of the communication antennas 92. The IPU 59 is located on the opposite surface of the plate member 69 from the surface facing the reverse surface 72b of the casing 72 such that the IPU 59 is out of alignment with the cutouts 95. That is, the IPU 59 is located on the same side of the DCU 60 as the reverse surface of the DCU 60 such that the DCU 60 is out of alignment with the communication antennas 92. This prevents the interference of the IPU 59 with the radio wave directivity of the communication antennas 92.

As illustrated in FIGS. 10 and 11, the reverse surface 72b of the casing 72 defining the reverse side of the DCU 60 has a hole 96 for air escape (air hole) to eliminate the pressure difference between the outside and the inside of the casing 72. The air hole 96 is in a lower left portion of the reverse surface 72b of the casing 72 that is the surface in which the air hole 96 is formed. A coating sheet 97 (see FIG. 12) to close the air hole 96 from the inside of the casing 72 is attached to the portion of the casing 72 that has the air hole 96. The coating sheet 97 has the property of allowing passage of air but preventing passage of water. The coating sheet 97 prevents water ingress into the casing 72 via the air hole 96.

As illustrated in FIG. 10, the plate member 69 faces the reverse surface 72b of the casing 72 having the air hole 96, and covers the air hole 96. The plate member 69 is capable of preventing car washing water or the like from directly hitting the air hole 96 from behind (from a direction normal to the reverse surface 72b of the casing 72).

Figure 12:
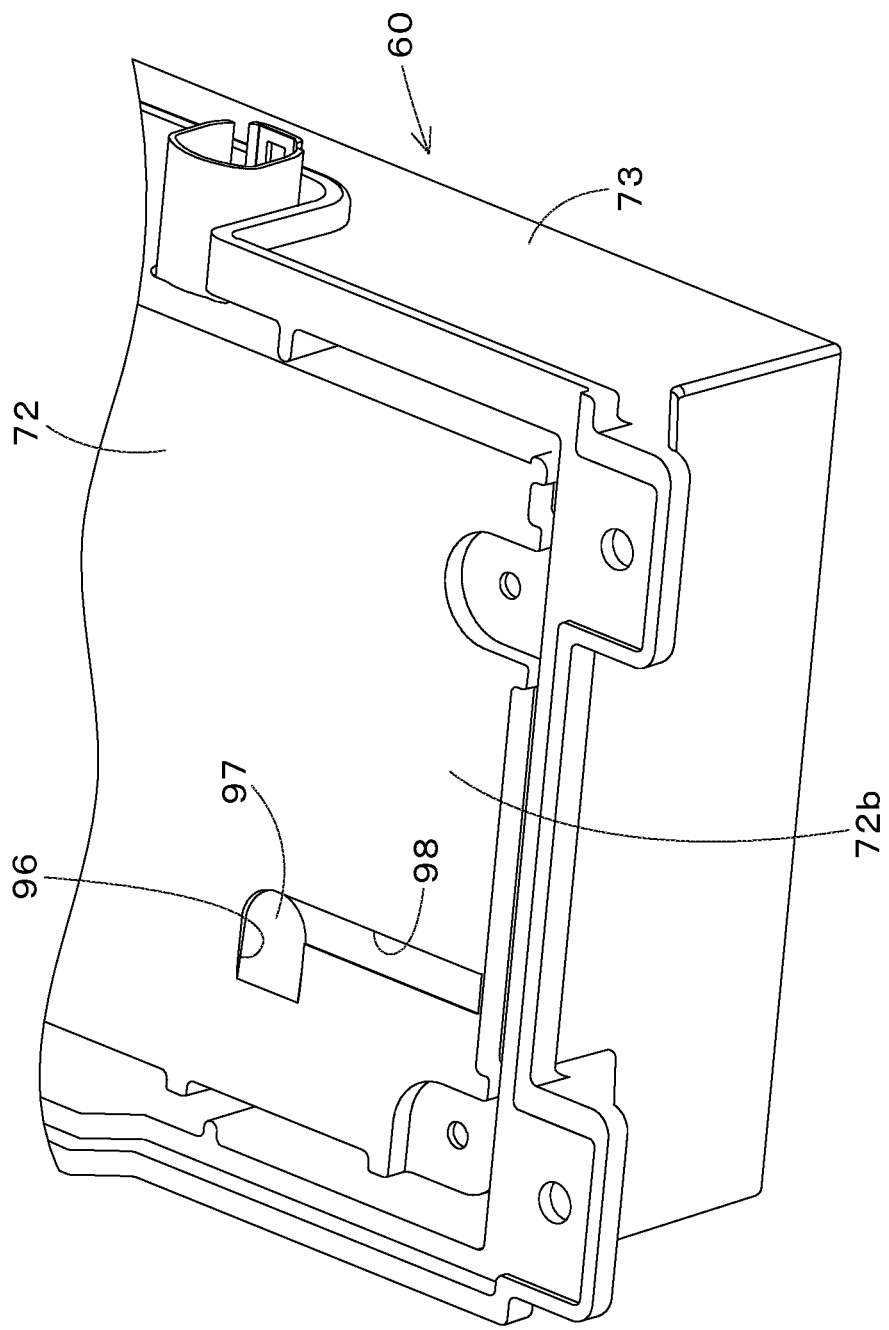
FIG. 12 is a bottom perspective view of a lower portion of the communication device.

As illustrated in FIG. 12, the reverse surface 72b of the casing 72 has a groove 98 extending downward from the air hole 96. One of opposite end portions of the groove 98 in a longitudinal direction (upper end) is in communication with the air hole 96, and the other of the opposite end portions of the groove 98 in the longitudinal direction (lower end) has an opening facing downward.

Figure 13:
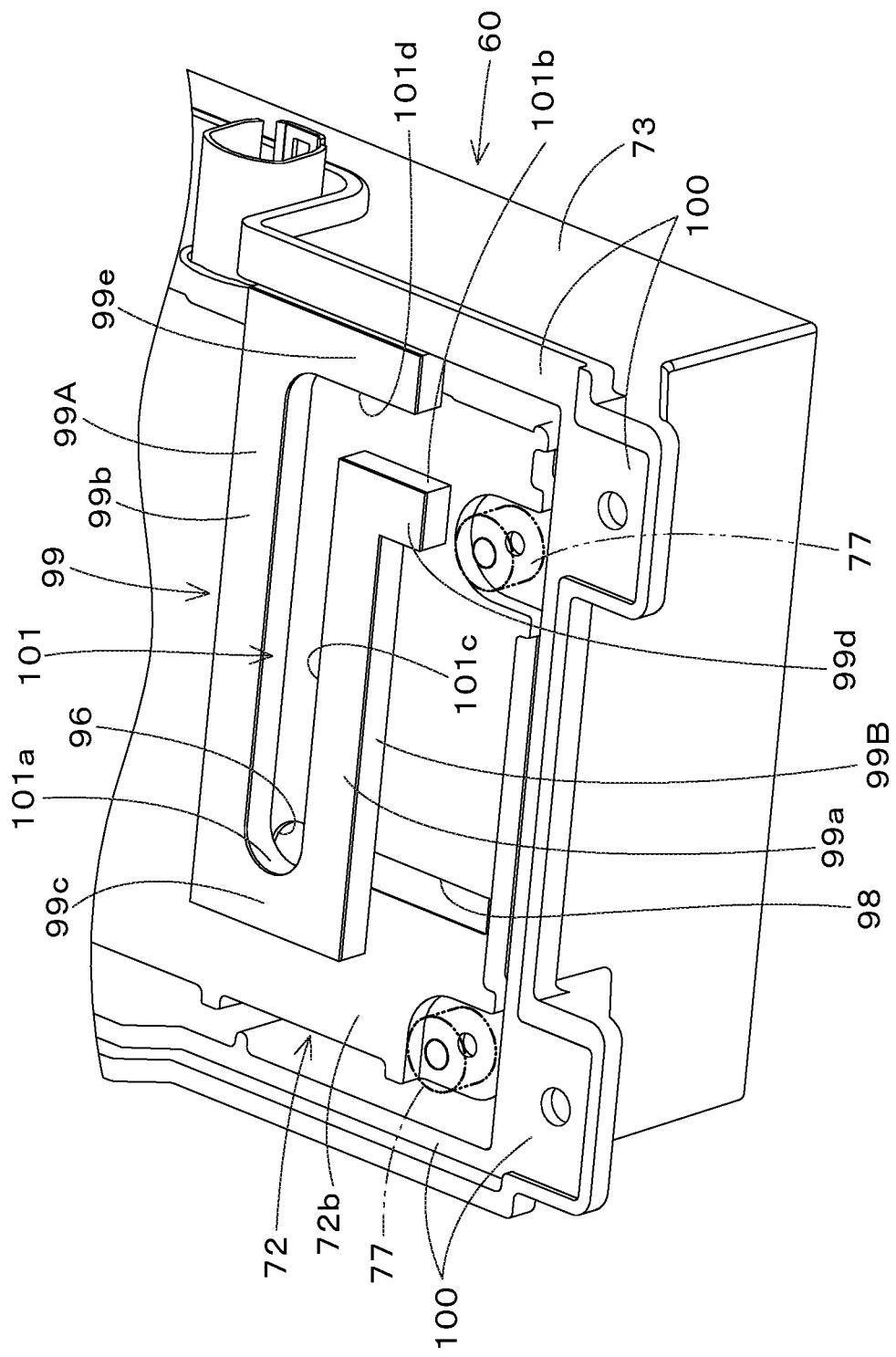
FIG. 13 is a bottom perspective view of the lower portion of the communication device and a sealing member.

As illustrated in FIGS. 10 and 11, the communication unit 58 includes a sealing member 99 interposed between the plate member 69 and the reverse surface 72b of the casing 72. The sealing member 99 is a member to seal up the air hole 96, and is interposed between the plate member 69 and the reverse surface 72*b* of the casing 72 to prevent water ingress into the casing 72 through the air hole 96. As illustrated in FIG. 13, the sealing member 99 includes an adhesive sheet 99A to bond the sealing member 99 to the plate member 69, and a sealing body 99B which abuts on the reverse surface 72*b* of the casing 72. The sealing body 99B is made of an elastic material such as expanded rubber with closed cells. The sealing member 99 is in the form of a plate in contact with the plate member 69 and the reverse surface 72*b* of the casing 72. This makes it possible to place the sealing member 99 in a narrow space between the plate member 69 and the reverse surface 72*b* of the casing 72, and possible to improve reliability (stability) of sealing. The plate member 69 abuts on an abutment surface 100 of the cover 73 and on the spacer members 77 such that a certain gap forms between the plate member 69 and the reverse surface 72*b* of the casing 72. With this, the plate member 69, when attached to the DCU 60, squeezes the sealing member 99 (sealing body 99B) to an appropriate extent.

Note that portions of the surface of the plate member 69 and the reverse surface 72*b* of the casing 72 that abut on the sealing member 99 may be flat or have an uneven profile. The shape of the sealing member 99 need only be a shape that achieves waterproofness when the sealing member 99 is interposed between the plate member 69 and the reverse surface 72*b* of the casing 72. The surface(s) of the sealing member 99 that abut(s) on the plate member 69 and/or the reverse surface 72*b* of the casing 72 may be flat or have an uneven profile conforming to that of the plate member 69 and/or the reverse surface 72*b* of the casing 72.

As illustrated in FIGS. 10 and 13, the sealing member 99 has a groove portion 101 passing through the sealing member 99 in the thickness direction. One of the opposite ends of the groove portion 101 in the longitudinal direction is closed, and the other of the opposite ends of the groove portion 101 is open. Specifically, the groove portion 101 includes a closed portion 101*a* at the one of the opposite ends, and an open portion 101*b* at the other of the opposite ends. When the sealing member 99 is interposed between the plate member 69 and the reverse surface 72*b* of the casing 72, one of opposite sides of the groove portion 101 in a direction orthogonal to the longitudinal direction is closed with the plate member 69, and the other of the opposite sides of the groove portion 101 is closed with the reverse surface 72*b* of the casing 72.

One of the opposite ends of the groove portion 101 in the longitudinal direction is in communication with the air hole 96. The open portion 101*b* has an opening facing downward. The groove portion 101 includes a horizontal groove portion 101*c* and a vertical groove portion 101*d*. The horizontal groove portion 101*c* includes the closed portion 101*a* at one end thereof, this end is in communication with the air hole 96, and the horizontal groove portion 101*c* extends horizontally (in a horizontal direction) from the air hole 96. The vertical groove portion 101*d* extends downward from the opposite end of the horizontal groove portion 101*c*. The vertical groove portion 101*d* includes the open portion 101*b* at the lower end thereof. The groove portion 101 allows escape of droplets (drainage of water) resulting from condensation and/or water that has entered the air hole 96 for some reasons. The groove portion 101 also allows the air hole 96 to communicate with the outside environment, making it possible to achieve air exchange through the air hole 96.

The following more specifically discusses the sealing member 99. As illustrated in FIGS. 10 and 13, the sealing member 99 includes a first section 99*a*, a second section 99*b*, a third section 99*c*, a fourth section 99*d*, and a fifth section 99*e*. The first section 99*a* is located lower than the air hole 96. The second section 99*b* is located higher than the air hole 96. The first section 99*a* and the second section 99*b* each extend horizontally (rightward) from the air hole 96. The third section 99*c* is located on one of the opposite sides (left side) of the air hole 96 in the horizontal direction, and connects the first section 99*a* and the second section 99*b*. The fourth section 99*d* extends downward from the end (right end) of the first section 99*a* on the other of the opposite sides of the air hole 96 in the horizontal direction. The fifth section 99*e* extends downward from the end (right end) of the second section 99*b* on the other of the opposite sides of the air hole 96 in the horizontal direction. Lower ends of the fourth section 99*d* and the fifth section 99*e* are not connected together.

The gap between the first section 99*a* and the second section 99*b* is the horizontal groove portion 101*c*. That is, the horizontal groove portion 101*c* is defined by the first section 99*a*, the second section 99*b*, and the third section 99*c*. The gap between the fourth section 99*d* and the fifth section 99*e* is the vertical groove portion 101*d*. That is, the vertical groove portion 101*d* is defined by the fourth section 99*d* and the fifth section 99*e*.

The first section 99*a* extends from one of opposite ends of the cutout 95B to the other of the opposite ends of the cutout 95B, and lies between the air hole 96 and the cutout 95B. That is, the sealing member 99 includes a section lying between the air hole 96 and the cutout 95B. The first section 99*a* prevents water ingress into the air hole 96 via the cutout 95. That is, even when the air hole 96 is present near the cutout 95B (communication antenna 92), it is possible to appropriately prevent water ingress into the air hole 96.

The second section 99*b* prevents water ingress into the air hole 96 from above. The third section 99*c* prevents water ingress into the air hole 96 from the left. The fourth section 99*d* prevents water ingress into the air hole 96 from the right.

In the first embodiment, the working machine 1 in which the DCU 60 and the IPU 59 are provided inside the cabin 5 provided on the machine body 2 is discussed as an example. Note, however, that the working machine 1 may be a working machine 1 in which a canopy instead of the cabin 5 is provided on the machine body 2. Alternatively, the working machine 1 may be a working machine 1 with no cabin 5 or canopy.

The following description discusses a second embodiment with reference to FIGS. 15 to 19.

Figure 15:
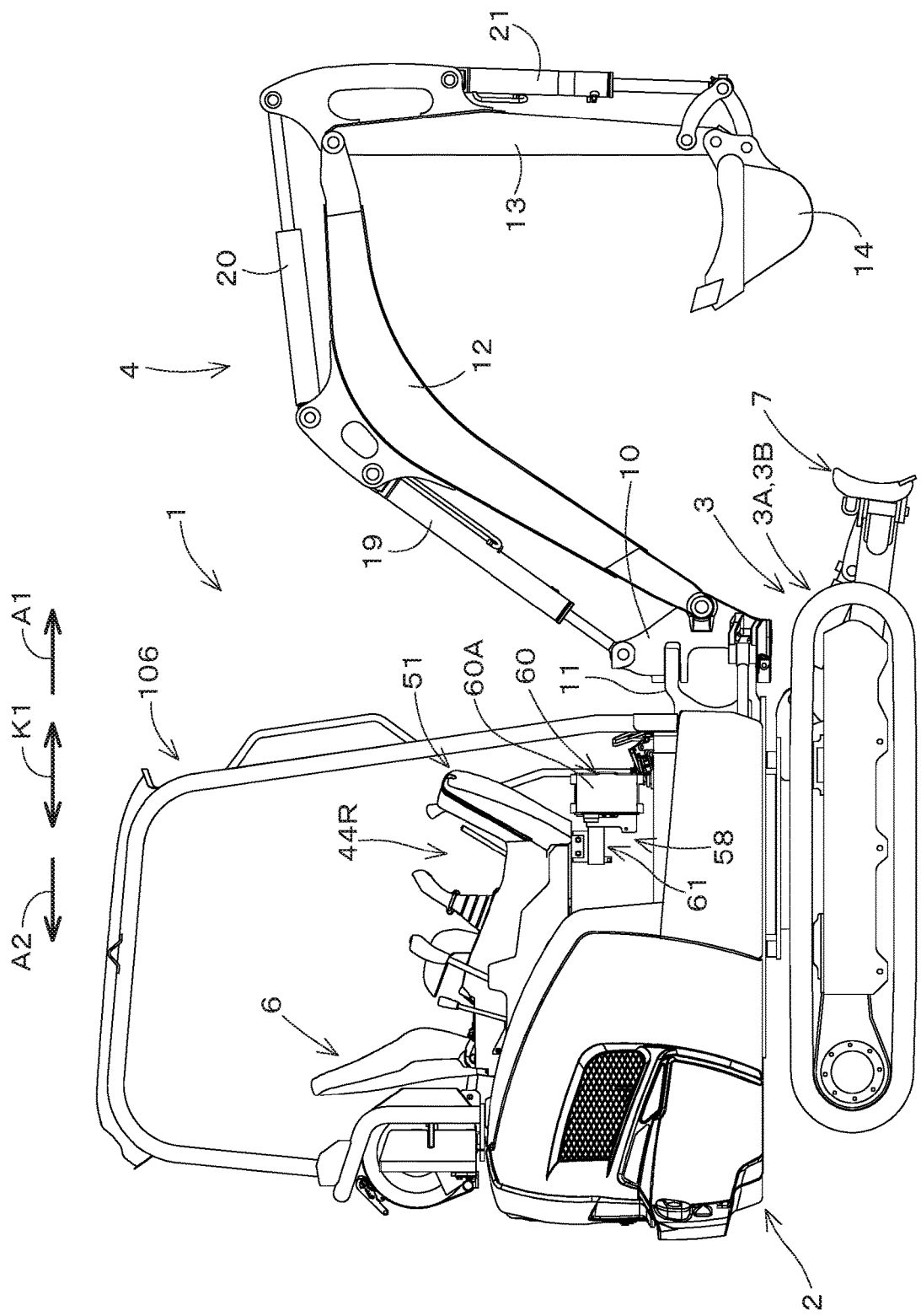
FIG. 15 is a side view of a working machine according to a second embodiment.
Figure 16:
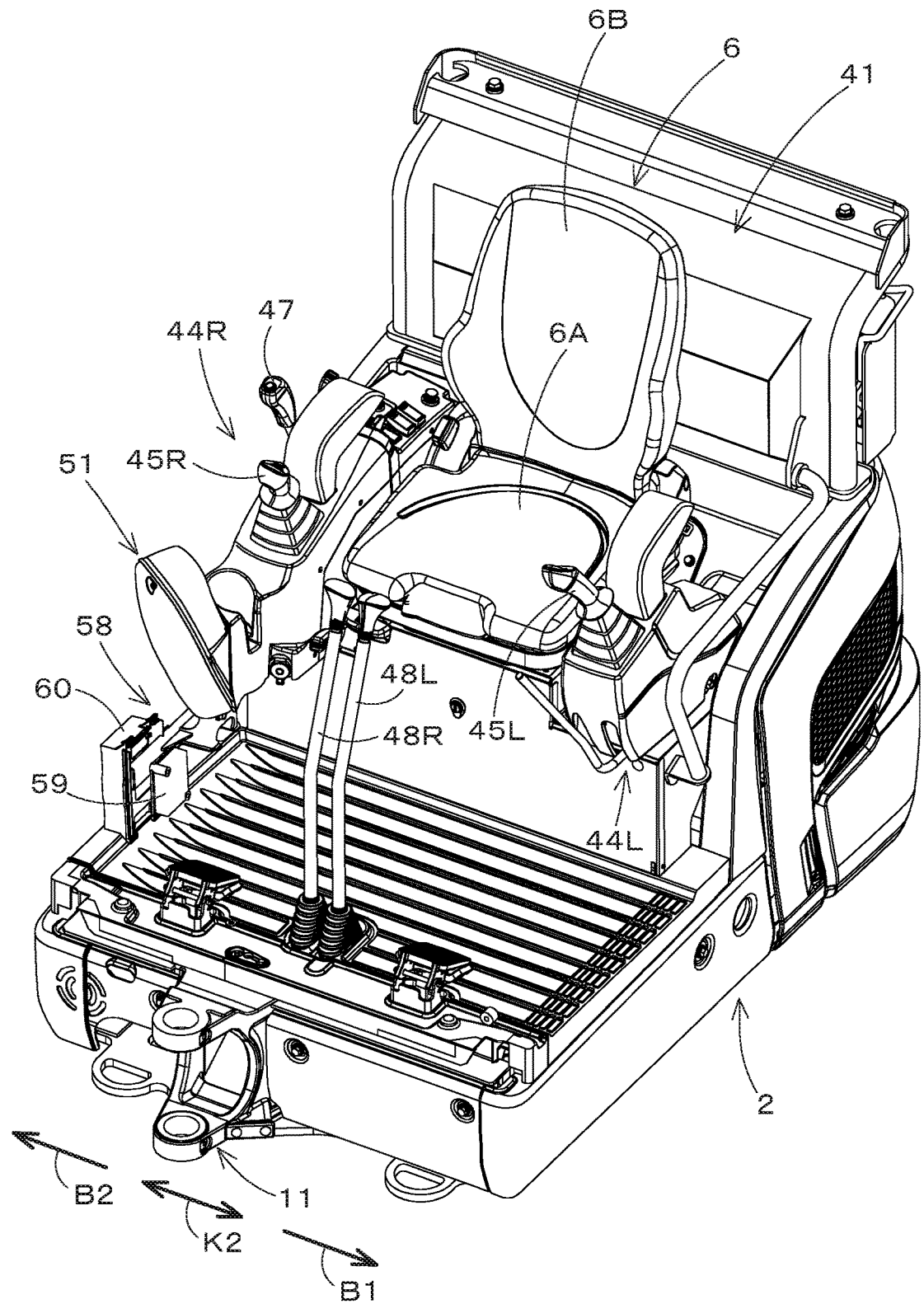
FIG. 16 is a perspective view of an operator section.

As illustrated in FIG. 15, the second embodiment shows an example in which a working machine 1, including a machine body having a four-pillar canopy 106 thereon, includes the communication unit 58. Also in the working machine of the second embodiment, the communication unit 58 is located in a front-right portion of the operator section 41. In the second embodiment, the DCU 60 and the IPU 59 are located diagonally forward and downward of the console 44R (meter 51) similarly to the first embodiment, but the DCU 60 is located with the obverse surface 60A thereof facing in a machine body width outward direction (rightward) and, as illustrated in FIG. 16, the IPU 59 is located on the left side of the DCU 60, i.e., located on the same side of the DCU 60 as the reverse surface of the DCU 60.

Figure 17:
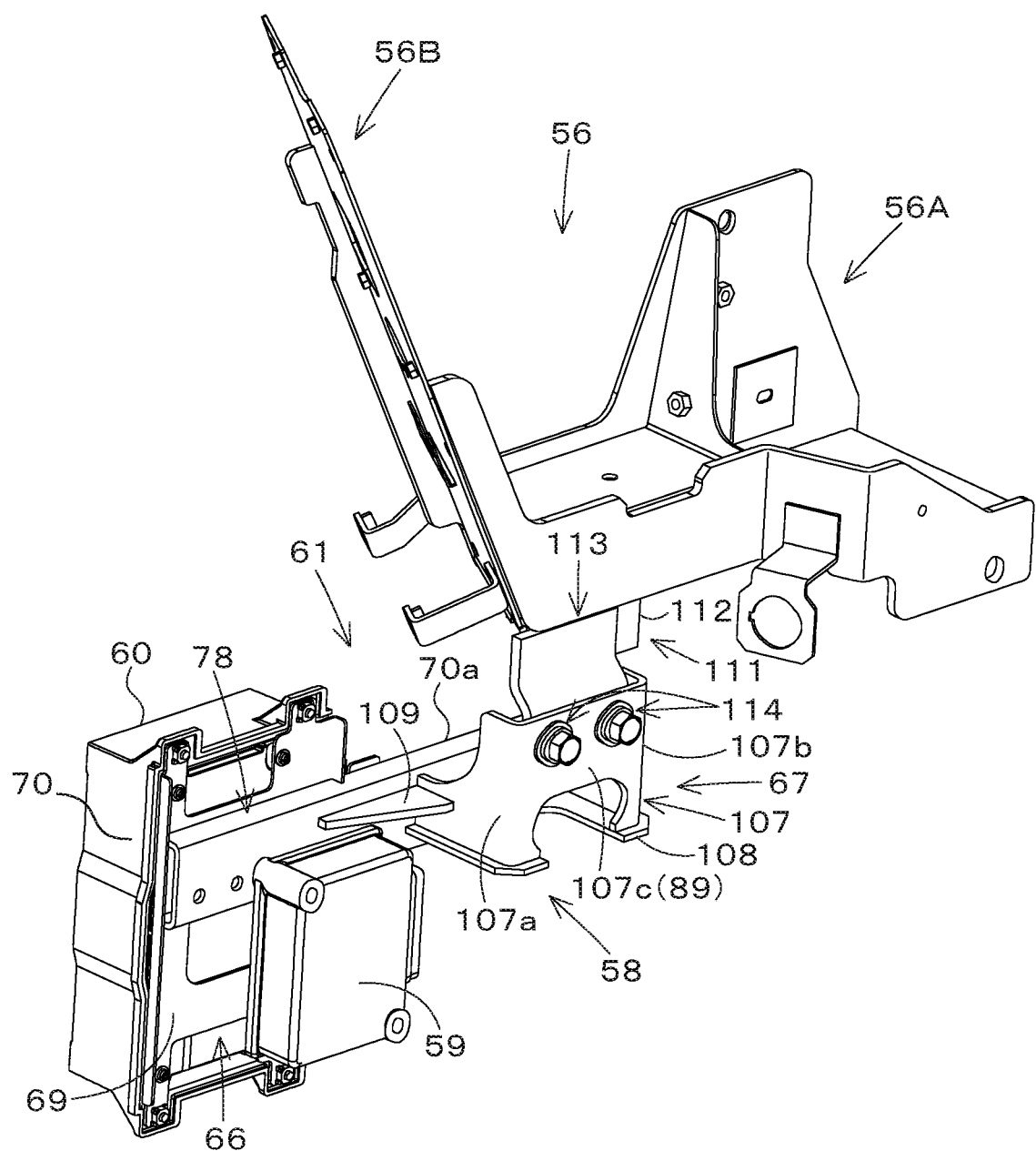
FIG. 17 is a top perspective view illustrating how a communication unit is arranged and attached.
Figure 18:
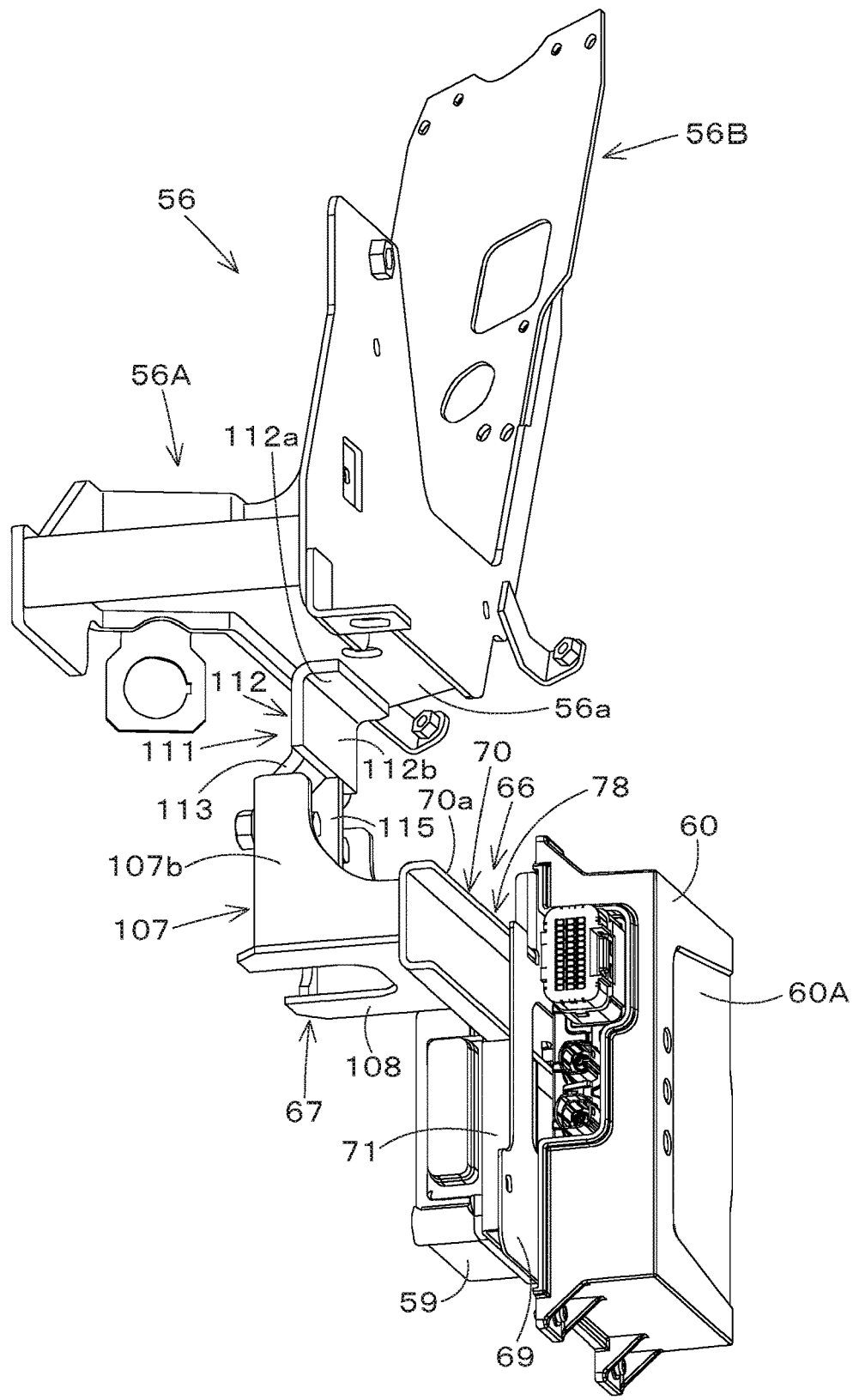
FIG. 18 is a bottom perspective view illustrating how the communication unit is arranged and attached.

As illustrated in FIGS. 17 and 18, similar to the first embodiment, also in the second embodiment, the mounting bracket includes a first bracket member 66 for attachment of the DCU 60 and the IPU 59 and a second bracket member 67 for attachment to the console 44R. The first bracket member 66 includes a first device mount (plate member) 69 and a second device mount 78. The plate member 69 has the DCU 60 attached thereto. The second device mount 78 has the IPU 59 attached thereto. The second device mount 78 includes a first member 70 and a second member 71. The first member 70 and the second member 71 are each formed of channel steel.

Figure 19:
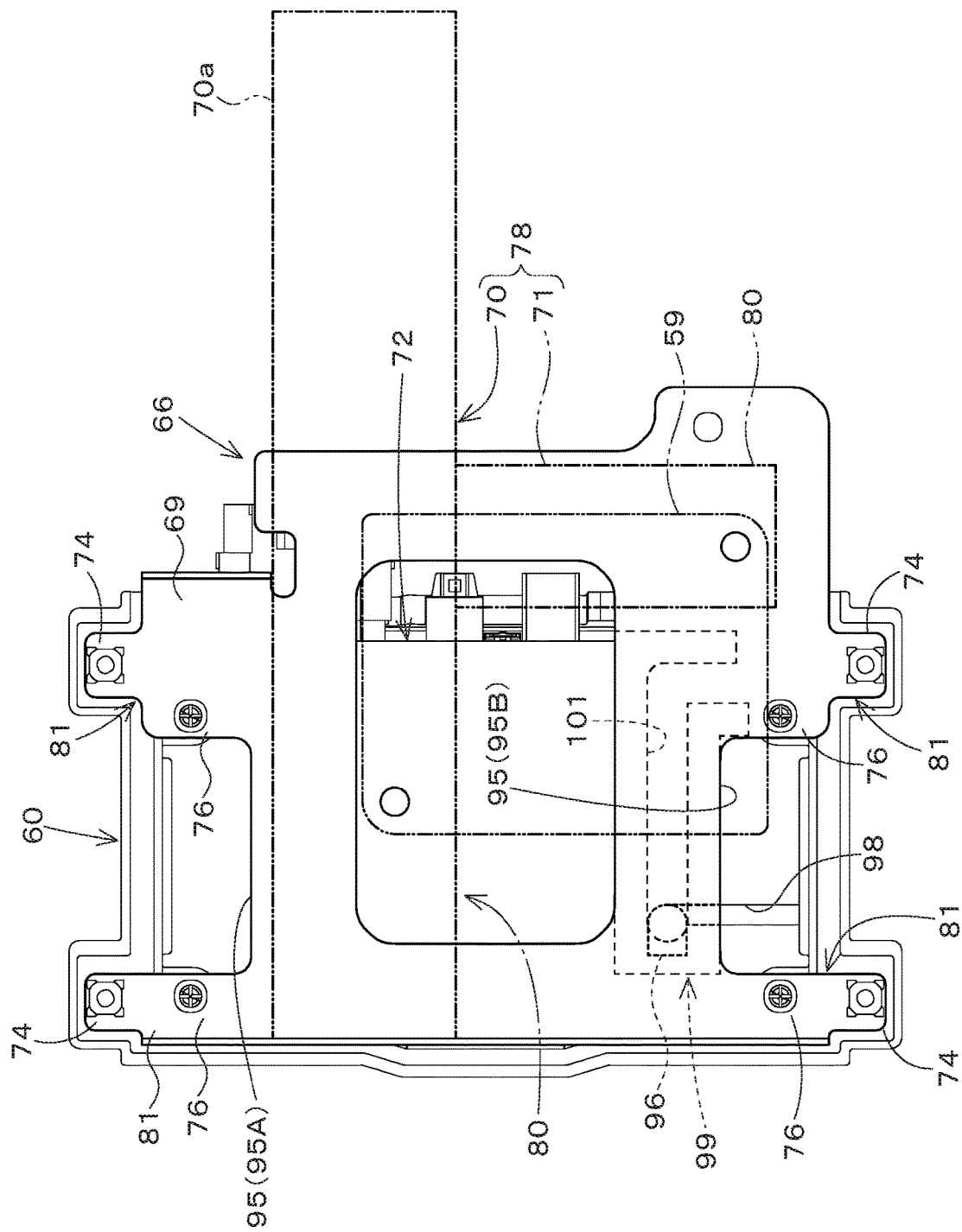
FIG. 19 is a side view illustrating how the communication unit is attached.

As illustrated in FIG. 19, the first member 70 extends in the front-rear direction K1 such that its open side faces the plate member 69 (faces rightward), and is fixed to an upper portion of the left surface of the plate member 69. The first member 70 includes a projecting portion 70a which is a rear portion thereof, and the projecting portion 70a projects rearward from the plate member 69. The second member 71 is positioned upright such that its open side faces the plate member 69 (faces rightward). The second member 71 is located below the first member 70 and fixed to a rear portion of the plate member 69. The IPU 59 is attached to a front portion of the first member 70 and a lower portion of the second member 71 with fastener(s) such as bolt(s). The front portion of the first member 70 and the lower portion of the second member 71 constitute a first attachment portion 80 for attachment of the IPU 59.

Figure 20:
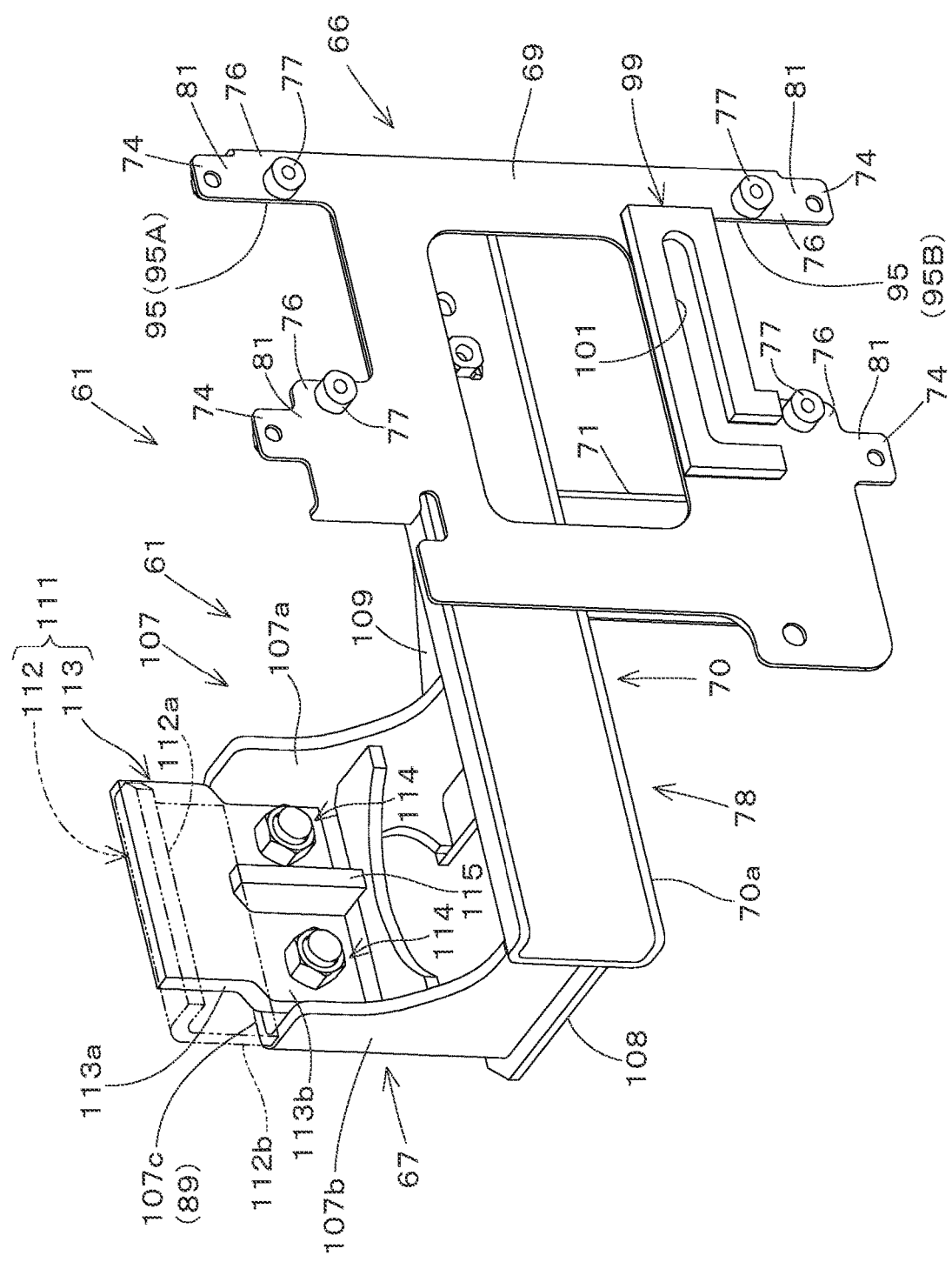
FIG. 20 is a perspective view of a mounting bracket.

As illustrated in FIGS. 17, 18, and 20, the second bracket member 67 includes an attachment member 107, a lower plate member 108, a reinforcing plate 109, and a connecting plate 110. The attachment member 107 includes a front wall 107a, a rear wall 107b located rearward of the front wall 107a with a space therebetween, and a side wall 107c which connects left edges of the front wall 107a and the rear wall 107b. The front wall 107a and the rear wall 107b are fixed to the left surface of the projecting portion 70a of the first member 70. The lower plate member 108 is fixed to a lower surface of the attachment member 107 and connects the front wall 107a and the rear wall 107b. The lower plate member 108 is also fixed to the left surface of the projecting portion 70a of the first member 70. The reinforcing plate 109 connects the front wall 107a and the projecting portion 70a. The connecting plate 110 connects together an intermediate portion of the front wall 107a in the up-and-down direction and an intermediate portion of the rear wall 107b in the up-and-down direction.

As illustrated in FIGS. 17, 18, and 20, the front frame 56 includes an attachment stay 111. The attachment stay 111 includes a first stay plate 112 and a second stay plate 113. The first stay plate 112 includes an upper wall 112a fixed to a base plate 56a of the front frame 56 and an extension wall 112b which extends downward from a left edge of the upper wall 112a.

The second stay plate 113 has an upper portion 113a fixed to a left surface of the extension wall 112b of the first stay plate 112 and has a lower portion 113b located on a right surface of the side wall 107c of the attachment member 107. The side wall 107c of the attachment member 107 is attached to the lower portion 113b of the second stay plate 113 with fastener(s) 114 including bolt(s) and nut(s). As illustrated in FIG. 20, a reinforcing plate 115 is fixed to a right surface of the second stay plate 113. The reinforcing plate 115 has an upper edge thereof fixed to a lower edge of the first stay plate 112. The side wall 107c of the second bracket member 67 constitutes a third attachment portion 89 for attachment of the mounting bracket 61 to the console 44R.

Other configurations are similar to those of the first embodiment, and therefore descriptions therefor are omitted here.

Note that the arrangement of the communication unit 58 (DCU 60, IPU 59) in the second embodiment may be applied to a working machine 1 with a cabin. In such a case, glass is provided rightward of the DCU 60, and the DCU 60 is positioned such that the DCU 60 faces toward the glass.

The following description discusses a third embodiment with reference to FIGS. 21 to 28.

Figure 21:
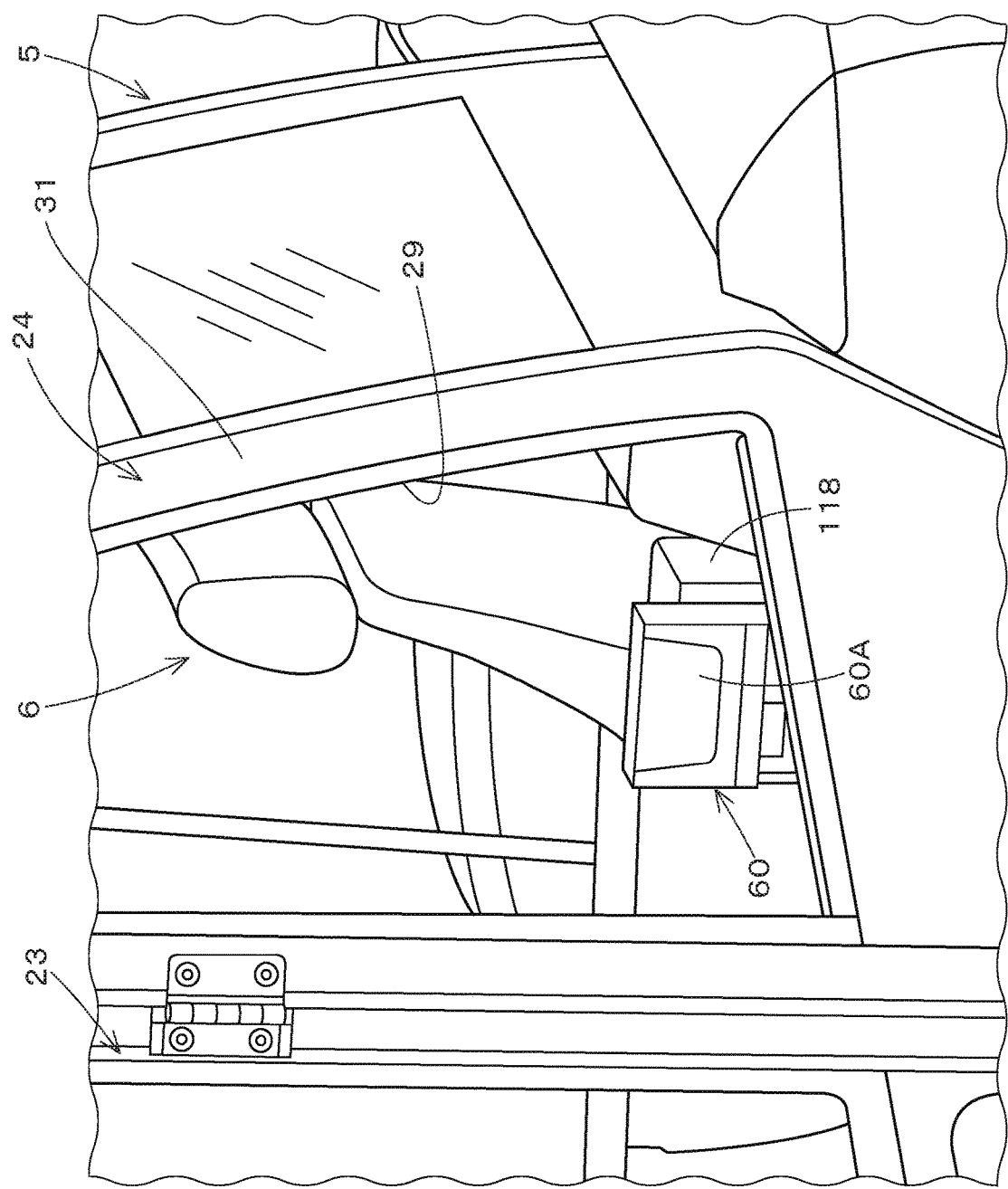
FIG. 21 is a perspective view illustrating how a communication unit is arranged, according to a third embodiment.
Figure 22:
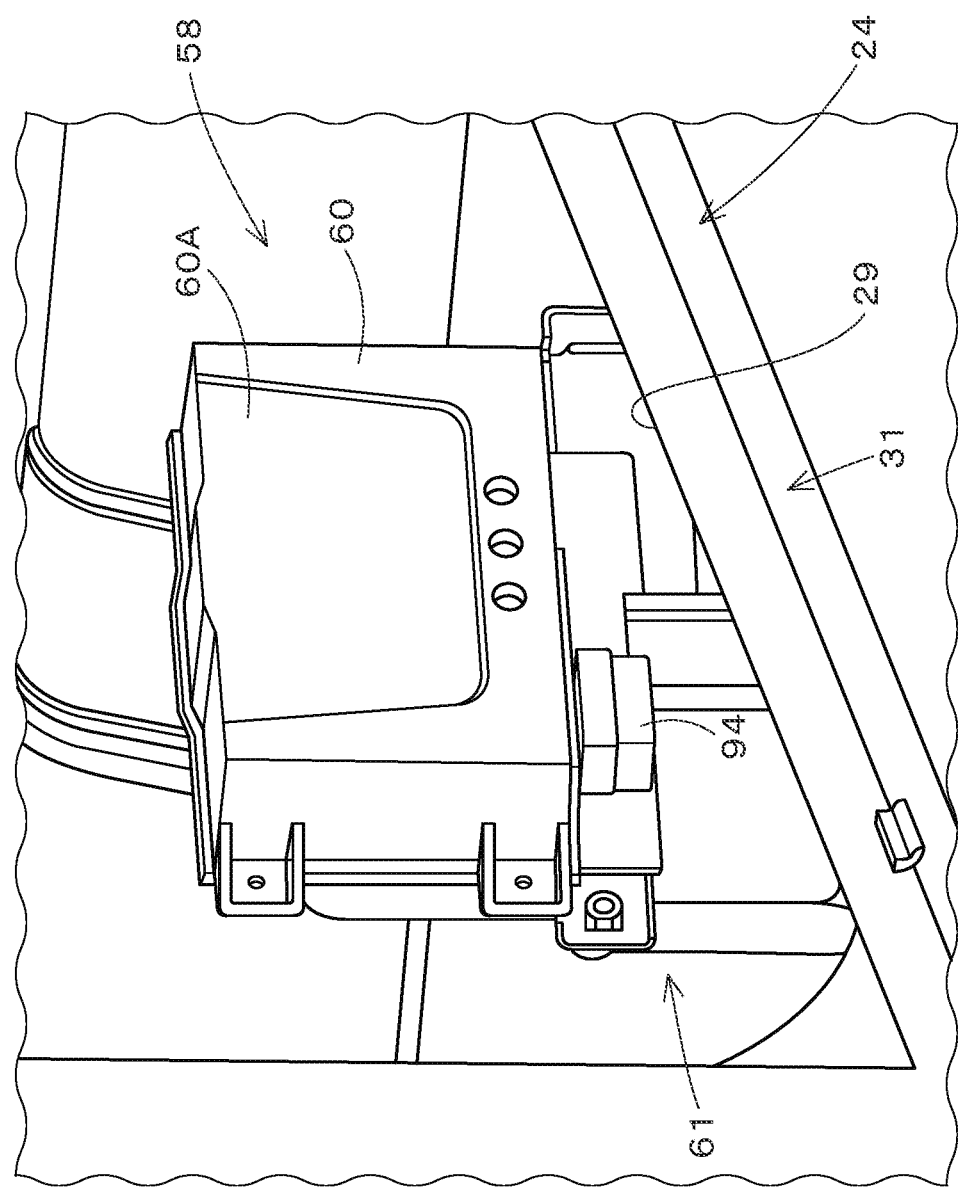
FIG. 22 is a perspective view of a communication device and other components as seen from the obverse side.
Figure 23:
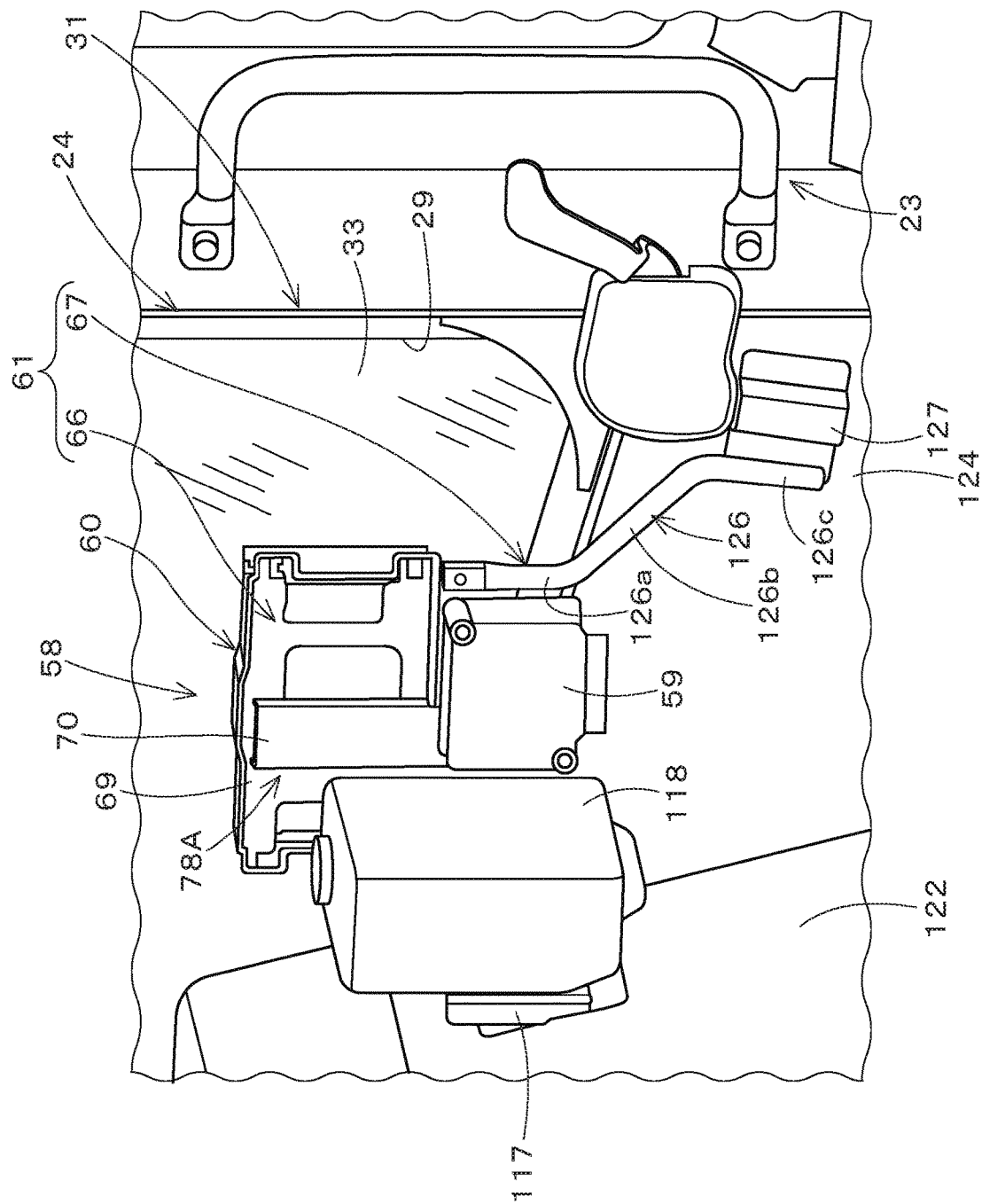
FIG. 23 is a perspective view of the communication unit as seen from the interior of a cabin.
Figure 24:
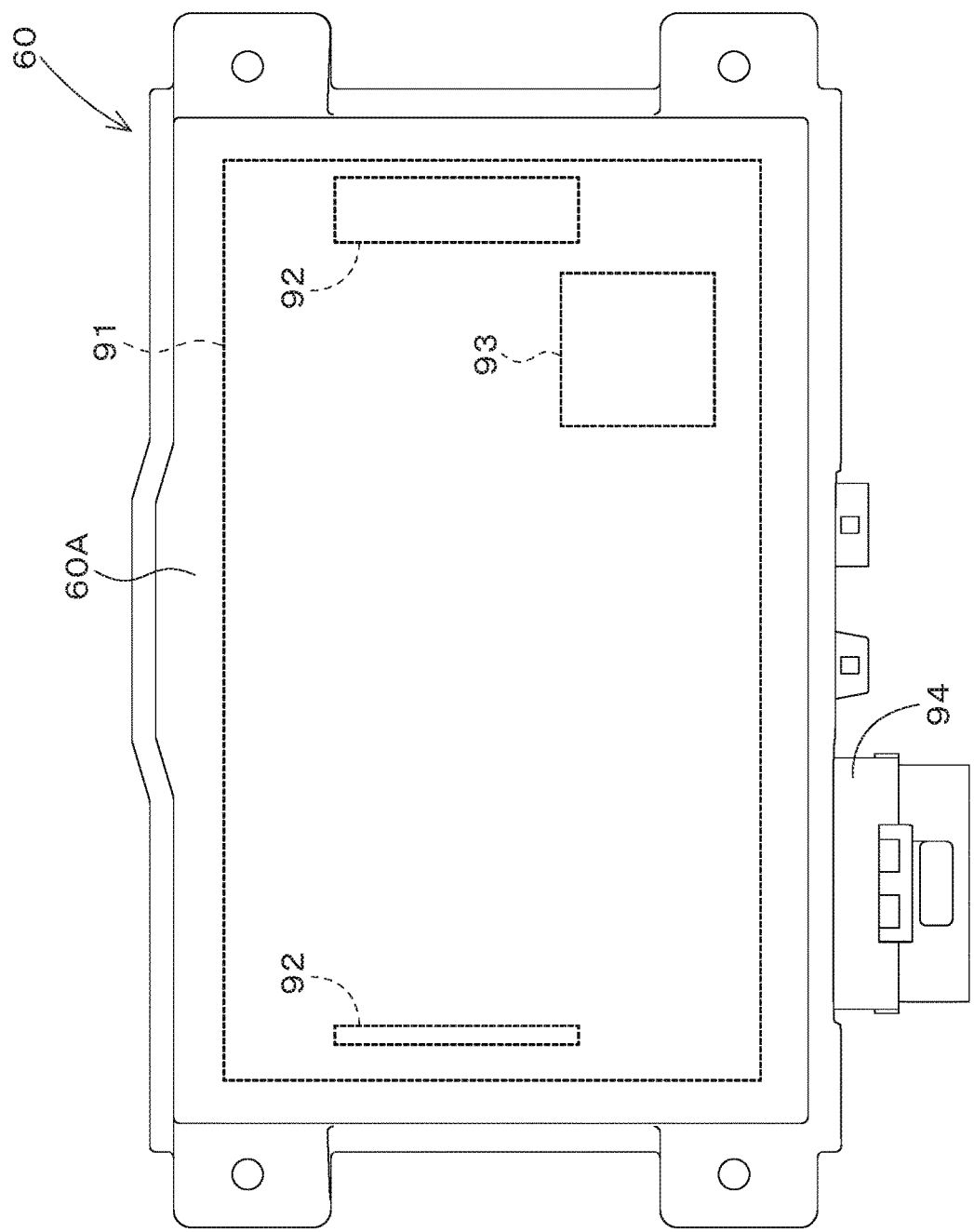
FIG. 24 is an obverse view of the communication device.

In the third embodiment, as illustrated in FIGS. 21 and 22, the communication unit 58 is located diagonally leftward and rearward of the operator's seat 6 inside the cabin 5 near the inner surface of the side window 24. The DCU 60 is located higher than a lower edge of the window frame 31 of the side window 24. The DCU 60 is positioned such that the obverse surface 60A thereof faces leftward (faces in the machine body outward direction). As illustrated in FIG. 23, the DCU 60 is positioned such that the obverse surface 60A thereof faces toward the side glass 33. In the third embodiment, the DCU 60 is positioned sideways with the connector 94 pointing downward such that the longitudinal direction of its rectangular parallelepiped matches a horizontal direction (in the example in FIG. 23, the front-rear direction K1). Thus, in the third embodiment, as illustrated in FIG. 24, the communication antennas 92 are located at front and rear portions of the DCU 60. The positioning antenna 93 is located at a lower rear portion of the DCU 60.

Figure 25:
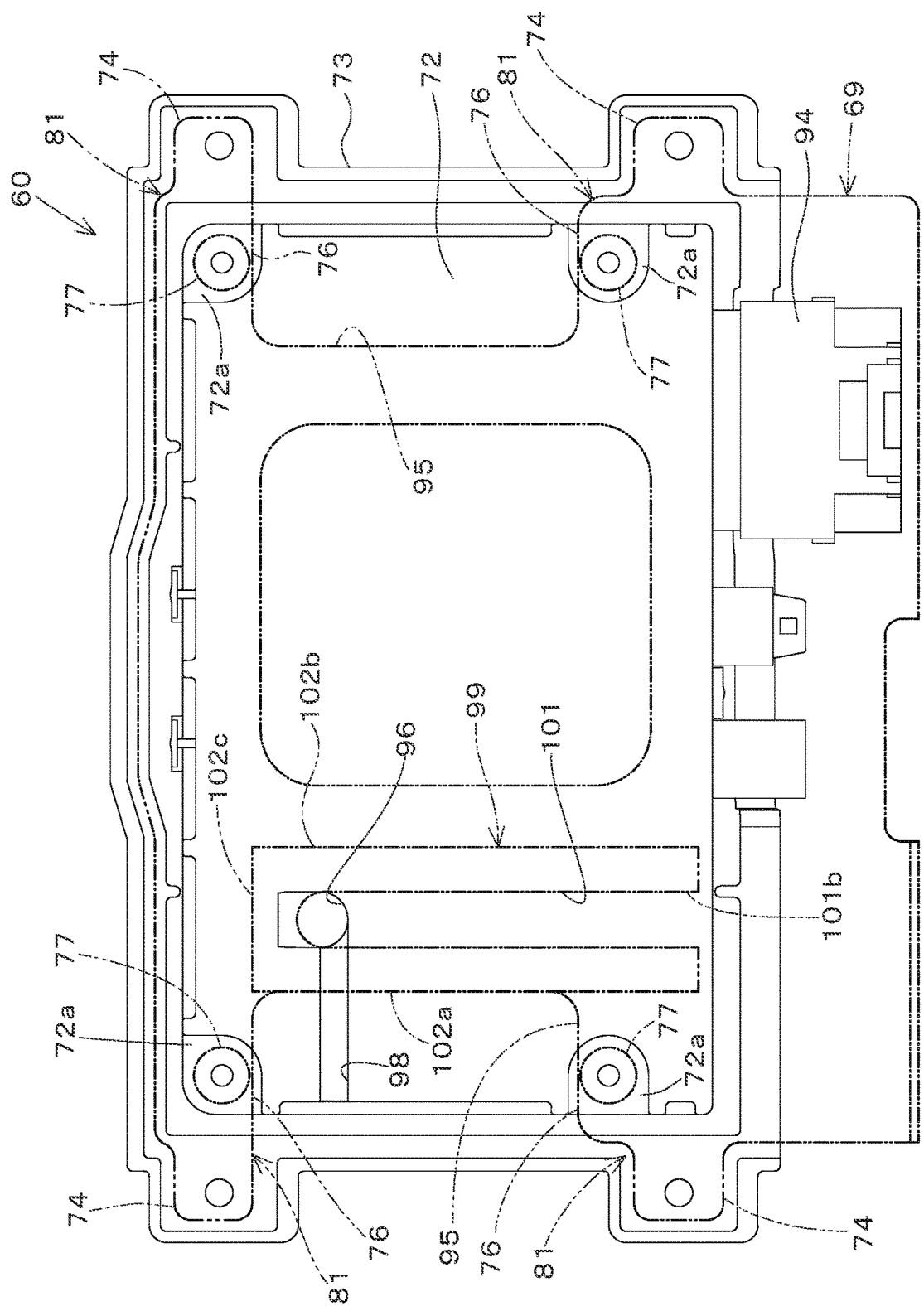
FIG. 25 is a reverse view of the communication device.

As illustrated in FIG. 25, the air hole 96 is located at an upper rear portion of the DCU 60. The sealing member 99 is in the form of a rectangle elongated in the up-and-down direction. The groove portion 101 extends in the up-and-down direction, and is in the form of a vertically elongated groove including opposite ends in the longitudinal direction one of which is a closed upper end and the other of which is an open lower end. In other words, the groove portion 101 includes the upper end in communication with the air hole 96, extends downward from the air hole 96, and includes the open portion 101b at the lower end. The groove portion 101 is defined by a first portion 102a, a second portion 102b, and a third portion 102c of the sealing member 99. The first portion 102a is located on one of opposite sides of the air hole 96 in a horizontal direction (located rearward of the air hole 96). The second portion 102b is located on the other of the opposite sides of the air hole 96 in the horizontal direction (located forward of the air hole 96). The third portion 102c is located higher than the air hole 96 and connects the first portion 102a and the second portion 102b. The first section 102a lies between the air hole 96 and the cutout 95B.

Figure 26:
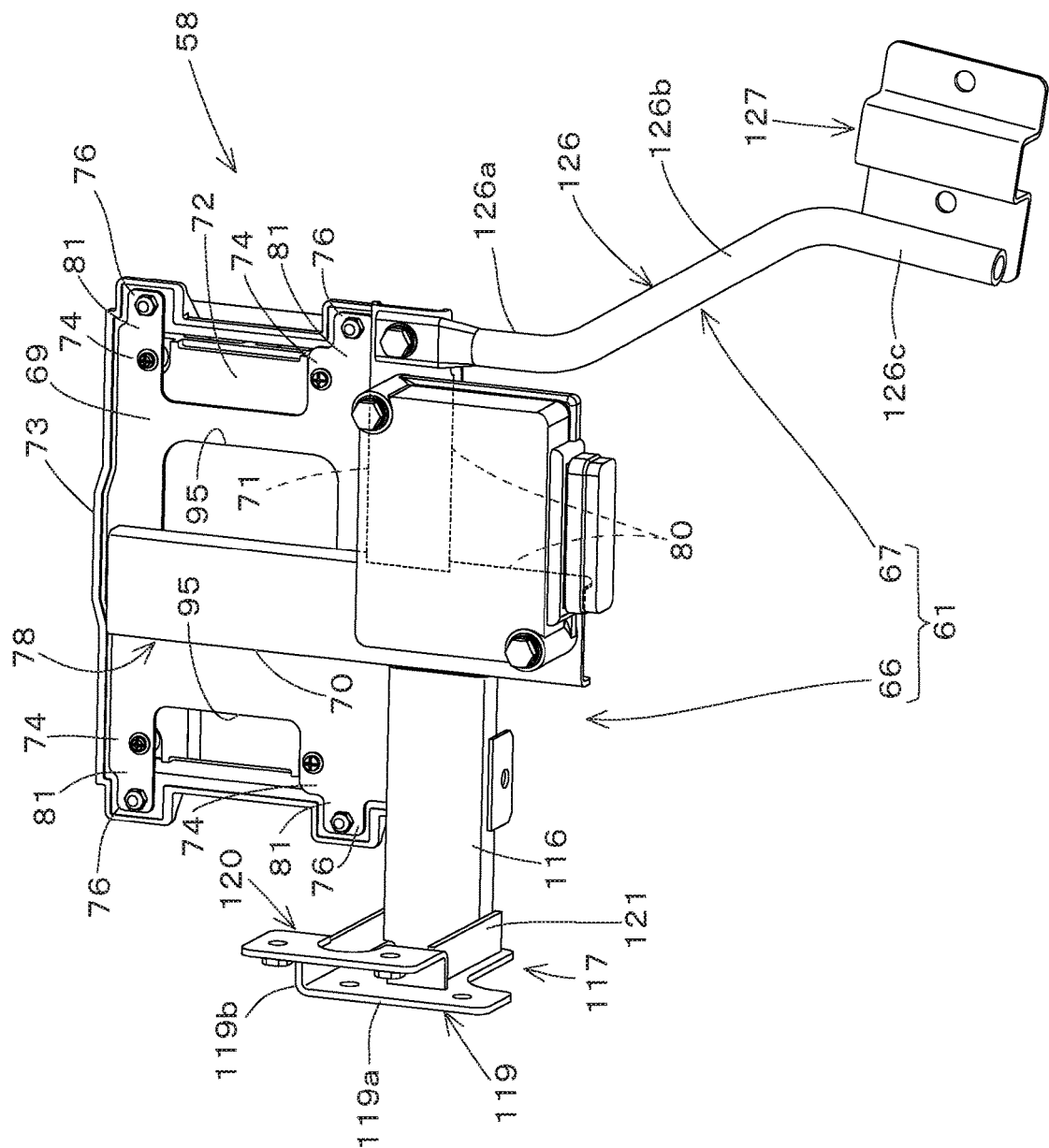
FIG. 26 is a side perspective view of the communication unit.
Figure 27:
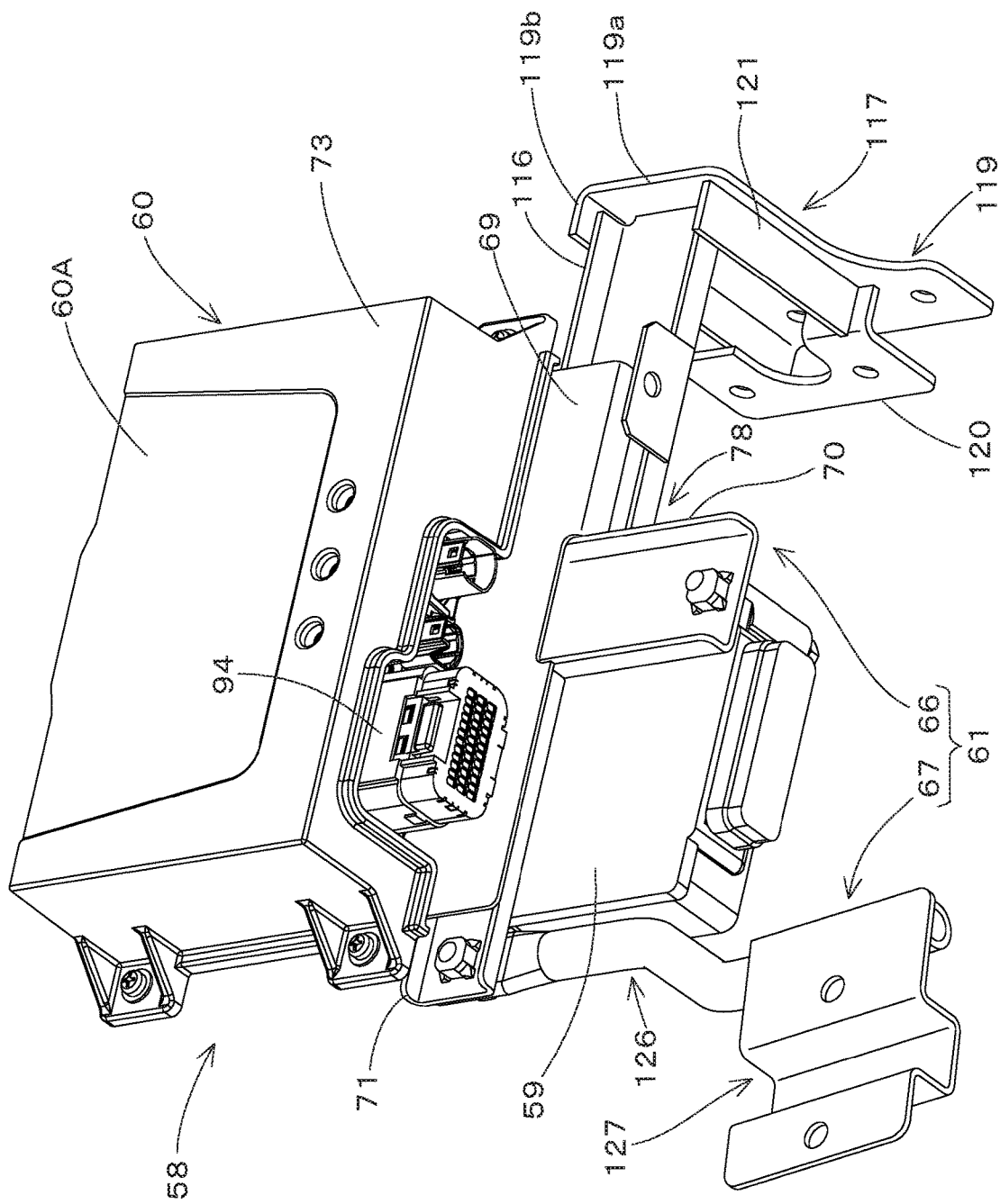
FIG. 27 is a bottom perspective view of the communication unit.
Figure 28:
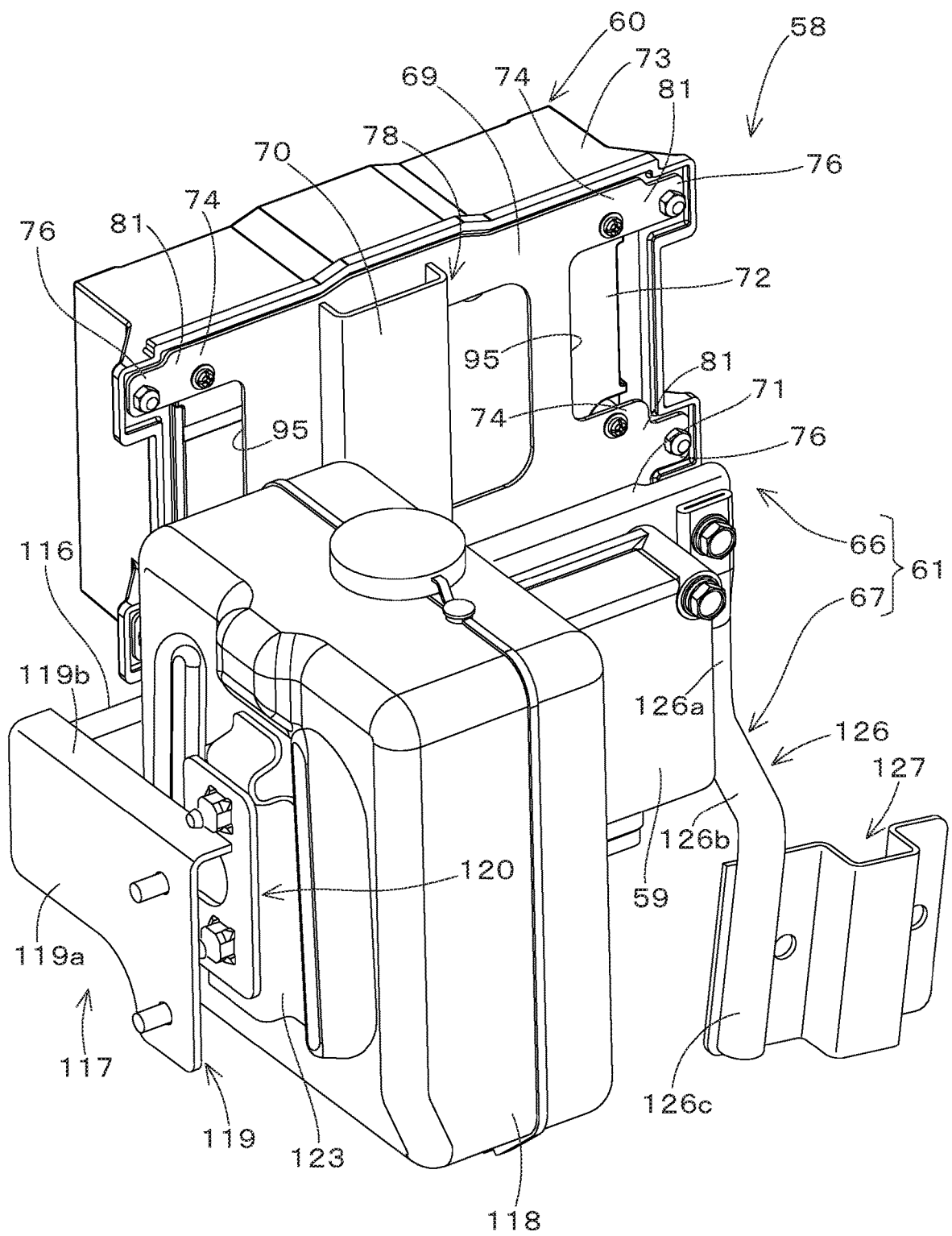
FIG. 28 is a top perspective view of the communication unit

As illustrated in FIGS. 26, 27, and 28, the mounting bracket 61 for attachment of the DCU 60 and the IPU 59 includes a first bracket member 66 and a second bracket member 67. The first bracket member 66 includes a first device mount (plate member) 69 for attachment of the DCU 60, a second device mount 78 for attachment of the IPU 59, and a bracket attachment member 116. The second device mount 78 includes a first member 70 and a second member 71 which are each formed of channel steel and fixed to a right surface of the plate member 69. The first member 70 extends in the up-and-down direction with its open side facing the plate member 69 (facing leftward), and is fixed to an intermediate portion of the plate member 69 in the front-rear direction K1. The second member 71 extends in the front-rear direction K1 with its open side facing the plate member 69 (facing leftward). The second member 71 is located forward of the first member 70 and is fixed to a lower portion of the plate member 69.

As illustrated in FIG. 26, the IPU 59 is fixed to a lower portion of the first member 70 and a front portion of the second member 71 with bolts. The lower portion of the first member 70 and the front portion of the second member 71 constitute a first attachment portion 80 for attachment of the IPU 59.

As illustrated in FIGS. 26 and 27, the bracket attachment member 116 is formed of channel steel, has its open side facing the plate member 69 (facing leftward), and extends in the front-rear direction K1. The bracket attachment member 116 is located rearward of the first member 70 and is fixed to a lower portion of the plate member 69. The bracket attachment member 116 has its rear portion projecting rearward from the plate member 69. The rear portion of the bracket attachment member 116 is attached to a tank stay 117. Although the bracket attachment member 116 is welded to the tank stay 117 in the present embodiment, the bracket attachment member 116 may be fixed to the tank stay 117 with bolt(s).

As illustrated in FIGS. 26, 27, and 28, the tank stay 117 supports a window washer tank (tank) 118 for storage of window washing liquid. The window washer tank 118 is located inside the cabin 5. The window washer tank (tank) 118 is located rearward of the DCU 60. The tank stay 117 includes an attachment stay 119, a support stay 120, and a reinforcing plate 121. The attachment stay 119 includes a main wall 119a and a bent wall 119b which extends forward from an upper edge of the main wall 119a. The main wall 119a is attached to a wall portion (first wall portion) 122 at the rear of the cabin 5 with bolt(s) (see FIG. 23). The attachment stay 119 has, fixed to a front surface of its left portion, a rear portion of the bracket attachment member 116. The support stay 120 is fixed to a front surface of a right portion of the attachment stay 119. The reinforcing plate 121 is fixed to a front surface of the main wall 119a and is fixed to the bracket attachment member 116 and the attachment stay 119. The window washer tank 118 includes an attachment part 123 fixed to a rear surface of the tank. The attachment part 123 is fixed to the support stay 120 with bolt(s).

As illustrated in FIG. 23, the second bracket member 67 is located on the opposite side of the first bracket member 66 from the tank stay. Specifically, the second bracket member 67 is located forward of the IPU 59. The second bracket member 67 has one of its opposite ends attached to the first bracket member 66 and has the other of the opposite ends attached to a wall portion (second wall portion) 124 of the cabin 5. The second wall portion 124 is located rearward of a lower portion of the entrance/exit door 23 of the cabin 5. Specifically, the second wall portion 124 is, for example, a door lock cover which covers a door locking mechanism to lock the entrance/exit door 23.

The second bracket member 67 is described in detail. As illustrated in FIGS. 23, 26, 27, and 28, the second bracket member 67 includes a first element 126 and a second element 127. The first element 126 is formed of a rod, and has an upper portion 126a thereof fixed to a front portion of the second member 71 with bolt(s). The first element 126 includes the upper portion 126a extending downward from a front portion of the second member 71, an intermediate portion 126b inclined forward in the downward direction from the upper portion 126a, and a lower portion 126c extending downward from the intermediate portion 126b. The second element 127 is fixed to the lower portion 126c of the first element 126. The second element 127 is attached to the second wall portion 124 with bolt(s).

With regard to the mounting bracket 61 of the third embodiment, one end of the mounting bracket 61 is attached to the tank stay 117 and the opposite end of the mounting bracket 61 is attached to the second wall portion 124, making it possible to attach the communication unit 58 (a unit including the DCU 60, the IPU 59, and the mounting bracket 61) as an add-on to the working machine 1. Furthermore, since the one end of the mounting bracket 61 is supported on the tank stay 117 (first wall portion 122) and the opposite end of the mounting bracket 61 is supported on the second wall portion 124, the mounting bracket 61 is supported at opposite ends thereof and capable of firmly supporting the DCU 60 and the IPU 59. Even when the mounting bracket 61 is attached to the tank stay 117, the tank stay 117 is capable of firmly supporting the window washer tank 118.

Other configurations are similar to those of the first embodiment and the second embodiment, and therefore descriptions therefor are omitted here.

The location (arrangement) of the communication unit 58 (DCU 60, IPU 59) is not limited to those described in the foregoing embodiments. For example, the DCU 60 may be located rearward of the backrest 6B of the operator's seat 6 such that the obverse surface 60A thereof faces rearward. In such a case, when the working machine 1 includes a cabin, the DCU 60 is located inside the cabin 5 such that the obverse surface 60A thereof faces a glass (rear glass) which closes the window opening of the rear window.

The DCU 60 may be located rearward of the operator's seat 6 such that the obverse surface 60A thereof faces diagonally rearward.

When the working machine 1 includes a canopy, the mounting bracket 61 may be attached to a connecting rod which connects a left rear pillar and a right rear pillar, a handrail located on one side of the operator's seat, and/or the like.

The mounting bracket 61 may be attached to a support frame which is attached to the machine body such that the support frame straddles the prime mover (engine) on a rear portion of the machine body 2.

Although the mounting bracket 61 is attached to member(s) (the console 44R, the support bracket 86, and/or the cabin 5) provided on the machine body 2 in the foregoing embodiments, the mounting bracket 61 may be attached directly to the machine body 2.

A communication unit 58 as described above includes an information processor (IPU 59), a communication device (DCU 60) to receive data from the information processor 59, the communication device (DCU 60) including a communication antenna 92 to transmit data, and a mounting bracket 61 for attachment of the communication device 60 and the information processor 59 to an object (machine body 2), wherein the communication device 60 and the information processor 59 are attached to the mounting bracket 61 such that the information processor 59 is located on the same side of the communication device 60 as a reverse surface of the communication device 60 and is out of alignment with the communication antenna 92.

With the configuration, the communication device 60 containing the communication antenna(s) 92 and the information processor 59 can be attached to the mounting bracket 61 to form a single unit and then mounted on an object (machine body 2). The communication device 60 and the information processor 59 can therefore be attached in a suitable manner. Furthermore, since the information processor 59 is attached to the mounting bracket 61 such that the information processor 59 is located on the same side of the communication device 60 as the reverse surface thereof, the communication device 60 and the information processor 59 can be arranged in a compact manner. Furthermore, since the information processor 59 is attached to the mounting bracket 61 such that the information processor 59 is located on the same side of the communication device 60 as the reverse surface thereof and that the information processor 59 is out of alignment with the communication antenna(s) 92, it is possible to eliminate or reduce the likelihood that the information processor 59 interferes with the directivity performance of the communication antenna(s) 92 contained in the communication device 60.

The mounting bracket 61 may include a plate member 69 attached to the reverse surface of the communication device 60. The plate member 69 may have a cutout 95 formed by cutting a portion corresponding to the communication antenna 92. The information processor 59 may be located on an opposite surface of the plate member 69 from a surface facing the reverse surface of the communication device 60 and be out of alignment with the cutout 95.

The configuration makes it possible to ensure the communication performance of the communication device 60 containing communication antenna(s) 92.

The communication device 60 may include an electronic substrate 91 including an obverse surface to which the communication antenna 92 is attached, a casing 72 housing the electronic substrate 91 such that the obverse surface of the electronic substrate 91 and an obverse surface of the communication device 60 face in the same direction, and a positioning antenna 93 to receive one or more satellite signals from one or more positioning satellites, the positioning antenna 93 being attached to the obverse surface of the electronic substrate 91.

The configuration makes it possible to ensure the communication performance of the communication device 60.

A working machine 1 includes a machine body 2 to which the communication unit 58 is attached, wherein the communication device 60 is positioned with an obverse surface thereof facing outward from the machine body.

The configuration makes it possible to ensure the communication performance of the communication device 60 containing communication antenna(s) 92.

The working machine 1 may further include a cabin 5 provided on the machine body 2 and including a glass surface (surface of a front glass 32, side glass 33, or the like). The communication device 60 may be located inside the cabin 5 such that the obverse surface 60A of the communication device 60 faces toward the glass surface.

The configuration makes it possible to ensure the communication performance of the communication device 60 containing communication antenna(s) 92.

The working machine 1 may further include an operator's seat 6, and a console 44R located on one side of the operator's seat 6. The communication device 60 may be located forward of the console 44R. The mounting bracket 61 may be attached to the console 44R.

The configuration makes it possible to eliminate or reduce the likelihood that the communication device 60 and the information processor 59 interfere with the operator's view.

The console 44R may include a meter 51 at a front portion thereof. The communication device 60 may be located diagonally forward and downward of the meter 51.

The configuration makes it possible to eliminate or reduce the likelihood that the communication device 60 and the information processor 59 interfere with the operator's view.

The working machine 1 may further include a support bracket 86 located on an opposite side of the console 44R from the operator's seat 6 and supporting a controller 85 of the working machine 1. The mounting bracket 61 may be attached to the support bracket 86.

With the configuration, the console 44R and the support bracket 86 can be used to achieve stable attachment of the mounting bracket 61.

The working machine 1 may further include a tank 118 located inside the cabin 5, and a tank stay 117 supporting the tank 118. The mounting bracket 61 may include a first bracket member 66 to which the information processor 59 and the communication device 60 are attached and which is attached to the tank stay 117, and a second bracket member 67 located on an opposite side of the first bracket member 66 from the tank stay, having one of opposite ends attached to the first bracket member 66, and having the other of the opposite ends attached to a wall portion 124 of the cabin 5.

With the configuration, the communication device 60, the information processor 59, and the tank 118 are supported at opposite ends by the tank stay 117 and the second bracket member 67. This makes it possible to firmly support the communication device 60 and the information processor 59 and firmly support the tank 118.

The communication device 60 may include an electronic substrate 91 including an obverse surface to which the communication antenna 92 is attached, a casing 72 housing the electronic substrate 91 such that the obverse surface of the electronic substrate 91 and an obverse surface 60A of the communication device 60 face in the same direction, and a positioning antenna 93 to receive one or more satellite signals from one or more positioning satellites, the positioning antenna 93 being attached to the obverse surface of the electronic substrate 91.

The configuration makes it possible to ensure the communication performance of the communication device 60.

A waterproof structure for a communication device 60 as described above is a waterproof structure for a communication device (DCU 60), the communication device (DCU 60) including a casing 72 that houses an electronic substrate 91 and has an air hole 96, the waterproof structure including a plate member 69 facing the casing 72 and attached to the casing 72 such that the plate member 69 covers the air hole 96, and a sealing member 99 interposed between the plate member 69 and the casing 72 to prevent ingress of water into the air hole 96 through a gap between the plate member 69 and the casing 72.

With the configuration, the plate member 69 and the sealing member 99 prevent water ingress into the casing 72 through the air hole 96.

The sealing member 99 may be in the form of a plate.

With the configuration, the sealing member 99 can be interposed in a compact manner between the plate member 69 and the casing 72, and sealing stability can be improved.

The sealing member 99 may include a groove portion 101, one of opposite ends of the groove portion 101 in a longitudinal direction being in communication with the air hole 96. The groove portion 101 may include, at the other of the opposite ends thereof in the longitudinal direction, an open portion 101b with an opening facing downward.

The configuration allows water to escape through the air hole 96.

The groove portion 101 may include a horizontal groove portion 101c including opposite ends one of which is in communication with the air hole 96 and extending in a horizontal direction from the air hole 96, and a vertical groove portion 101d extending downward from the other of the opposite ends of the horizontal groove portion 101c and including the open portion 101b at a lower end thereof.

The configuration makes it possible to prevent or reduce the ingress of water into the air hole 96 through the groove portion 101.

The sealing member 99 may include a first section 99a located lower than the air hole 96, a second section 99b located higher than the air hole 96, a third section 99c located on one of opposite sides of the air hole 96 in the horizontal direction and connecting the first section 99a and the second section 99b, a fourth section 99d extending downward from an end of the first section 99a on the other of the opposite sides of the air hole 96 in the horizontal direction, and a fifth section 99e extending downward from an end of the second section 99b on the other of the opposite sides of the air hole 96 in the horizontal direction. The horizontal groove portion 101c may be defined by the first section 99a, the second section 99b, and the third section 99c. The vertical groove portion 101d may be defined by the fourth section 99d and the fifth section 99e.

The configuration makes it possible to achieve a simple configuration of the sealing member 99.

The groove portion 101 may be a groove elongated vertically, the groove portion 101 including an upper end portion in communication with the air hole 96, extending downward from the air hole 96, and including the open portion 101b at a lower end thereof.

The configuration makes it possible to prevent or reduce the ingress of water into the air hole 96 through the groove portion 101.

The sealing member 99 may include a first portion 102a located on one of opposite sides of the air hole 96 in a horizontal direction, a second portion 102b located on the other of the opposite sides of the air hole 96 in the horizontal direction, and a third portion 102c located higher than the air hole 96 and connecting the first portion 102a and the second portion 102b. The groove portion 101 may be defined by the first portion 102a, the second portion 102b, and the third portion 102c.

The configuration makes it possible to achieve a simple configuration of the sealing member 99.

The communication device 60 may include a communication antenna 92B contained in the casing 72 in the vicinity of the air hole 96. The plate member 69 may have a cutout 95B in a portion corresponding to the communication antenna 92B. The sealing member 99 may include a section (first section 99a, first portion 102a) lying between the air hole 96 and the cutout 95B.

With the configuration, even when the air hole 96 is present near the cutout 95B, the section lying between the air hole 96 and the cutout 95B makes it possible to appropriately prevent water ingress into the air hole 96.

The waterproof structure may further include a cover 73 to cover an opposite surface of the casing 72 from a surface facing the plate member 69, the casing 72 being housed in a space defined by the plate member 69 and the cover 73.

With the configuration, the plate member 69 and the cover 73 appropriately prevent water ingress into the casing 72.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A waterproof structure for a communication device, the communication device comprising a casing that houses an electronic substrate and has an air hole, the waterproof structure comprising:
   a plate member facing the casing and attached to the casing such that the plate member covers the air hole; and
   a sealing member interposed between the plate member and the casing to prevent ingress of water into the air hole through a gap between the plate member and the casing, wherein:
   the sealing member includes a groove portion, one of opposite ends of the groove portion in a longitudinal direction being in communication with the air hole; and
   the groove portion includes, at the other of the opposite ends thereof in the longitudinal direction, an open portion with an opening facing downward.

2. The waterproof structure according to claim 1, wherein the sealing member is in the form of a plate.

3. The waterproof structure according to claim 1, wherein: the groove portion includes
   a horizontal groove portion including opposite ends one of which is in communication with the air hole and extending in a horizontal direction from the air hole, and
   a vertical groove portion extending downward from the other of the opposite ends of the horizontal groove portion and including the open portion at a lower end thereof.

4. The waterproof structure according to claim 3, wherein: the sealing member includes
   a first section located lower than the air hole,
   a second section located higher than the air hole,
   a third section located on one of opposite sides of the air hole in the horizontal direction and connecting the first section and the second section,
   a fourth section extending downward from an end of the first section on the other of the opposite sides of the air hole in the horizontal direction, and
   a fifth section extending downward from an end of the second section on the other of the opposite sides of the air hole in the horizontal direction;
   the horizontal groove portion is defined by the first section, the second section, and the third section; and
   the vertical groove portion is defined by the fourth section and the fifth section.

5. The waterproof structure according to claim 1, wherein the groove portion is a groove elongated vertically, the groove portion including an upper end portion in communication with the air hole, extending downward from the air hole, and including the open portion at a lower end thereof.

6. The waterproof structure according to claim 1, wherein: the sealing member includes
   a first portion located on one of opposite sides of the air hole in a horizontal direction,
   a second portion located on the other of the opposite sides of the air hole in the horizontal direction, and
   a third portion located higher than the air hole and connecting the first portion and the second portion; and
   the groove portion is defined by the first portion, the second portion, and the third portion.

7. The waterproof structure according to claim 1, wherein:
   the communication device receives data from an information processor and includes a communication antenna to transmit data; and
   the communication device and the information processor are attached to a mounting bracket such that the information processor is located on the same side of the communication device as a reverse surface of the communication antenna and is out of alignment with the communication antenna, the mounting bracket being a bracket for attachment of the communication device and the information processor to an object.

8. A waterproof structure for a communication device, the communication device comprising a casing that houses an electronic substrate and has an air hole, the waterproof structure comprising:
- a plate member facing the casing and attached to the casing such that the plate member covers the air hole; and
- a sealing member interposed between the plate member and the casing to prevent ingress of water into the air hole through a gap between the plate member and the casing, wherein:
- the communication device includes a communication antenna contained in the casing in the vicinity of the air hole;
- the plate member has a cutout in a portion corresponding to the communication antenna; and
- the sealing member includes a section lying between the air hole and the cutout.

9. A waterproof structure for a communication device, the communication device comprising a casing that houses an electronic substrate and has an air hole, the waterproof structure comprising:
- a plate member facing the casing and attached to the casing such that the plate member covers the air hole;
- a sealing member interposed between the plate member and the casing to prevent ingress of water into the air hole through a gap between the plate member and the casing; and
- a cover to cover an opposite surface of the casing from a surface facing the plate member, the casing being housed in a space defined by the plate member and the cover.

* * * * *